United States Patent [19]
Green et al.

[11] Patent Number: 5,536,964
[45] Date of Patent: Jul. 16, 1996

[54] COMBINED THIN FILM PINHOLE AND SEMICONDUCTOR PHOTODETECTORS

[76] Inventors: Evan D. H. Green, 766 Coffeewood Ct., San Jose, Calif. 95120; Tario M. Haniff, 2491 Ellsworth St. Apt. 20, Berkeley, Calif. 94704; Albert K. Hu, 1602 Briarpoint Dr., San Jose, Calif. 95131

[21] Appl. No.: 315,835

[22] Filed: Sep. 30, 1994

[51] Int. Cl.$^6$ .............................................. H01L 31/0232
[52] U.S. Cl. ..................... 257/432; 257/433; 257/443; 257/448; 257/466; 250/206.1; 250/208.6; 250/237 R
[58] Field of Search ................................. 257/447, 448, 257/443, 466, 432, 433, 434; 250/237 R, 208.6, 206.1

[56] References Cited

U.S. PATENT DOCUMENTS

| | | | |
|---|---|---|---|
| 4,649,270 | 3/1987 | Goldenberg | 250/237 R X |
| 5,025,297 | 6/1991 | Murakami et al. | 250/206.1 X |
| 5,051,801 | 9/1991 | Van Eijk et al. | 257/443 X |

FOREIGN PATENT DOCUMENTS

| | | | |
|---|---|---|---|
| 3910199 | 12/1989 | Germany | 250/208.6 |
| 4313278 | 11/1992 | Japan | 257/432 |
| 5013808 | 1/1993 | Japan | 257/443 |
| 1848223 | 8/1992 | Russian Federation | 257/432 |

OTHER PUBLICATIONS

H. J. Wolting, Single and Dual–Axis Lateral Photodetectors of Rectangular Shape, IEEE Transactions on Election Devices, pp. 581–590, (Aug. 1975).

B. O. Kelly, et al. Techniques for Using the Position Sensitivity of Silicon Photodetectors to Provide Remote Machine Control, *21st Annual IEEE Machine Tool Conference*, pp. 1–15, (Oct. 1973).

W. Light, Non–Contact Optical Position Sensing Using Silicon Photodetectors, United Detector Technology, Inc., Application Note, pp. 1–24, (Apr. 1982).

I. Edwards, "Using Photodetectors for Positions Sensing", (Dec. 1988), *Sensors*.

Centronic, Inc., Newbury Park, CA, Silicon Photodiodes 1994 Catalog, relevant catalog pp. 1994.

Newport Corporation, Irvine, CA, Optics Guide 5, pp. 16–18 Including Front and back covers, page bearing Copyright date–1990.

Newport Corporation, Irvine, CA, Scientific & Laboratory Products Catalog, pp. 1.14–1.17 including front and back covers and order info. page, Copyright 1992.

Y. P. Xu, et al. A Silicon–Diode Based Infrared Thermal Detector Array, *Sensors and Actuators A*, 37–38, pp. 226–230, (1993).

R. F. Wolffenbuttel, Silicon Micromachining for Integrated Radiant Sensors, *Sensors and Actuators A*, 36, pp. 109–115, (1992).

T. M. Haniff, et al., Self–aligning spatial filter, Proceedings of SPIE, vol. 2220, pp. 6–14, (1994).

T. Hirano, et al. Design, Fabrication and Operation of Submicron Gap Comb–Drive Microactuators, *Journal of Microelectromechanical Systems*, pp. 52–59, Mar. 1992.

*Primary Examiner*—William Mintel
*Attorney, Agent, or Firm*—Allston L. Jones

[57] ABSTRACT

A thin-film semiconductor pinhole component with monolithically integrated position-sensing photodetectors is herein referred to as a Position Sensitive Pinhole (PSP). Another embodiment is also discussed where a PSP is integrated onto a platform with controllable motion and is herein referred to as a Movable Position Sensitive Pinhole (MPSP). A third embodiment describes the MPSP with capacitive, electrostatic actuation incorporated into the device to achieve controlled motion, herein referred to as a Capacitively Actuated Movable Position Sensitive Pinhole (CAMPSP). Each of those embodiments of the present invention are discussed, as are their method of manufacture and use in a laser environment as a spatial filter.

22 Claims, 24 Drawing Sheets

COMBINED THIN FILM PINHOLE AND SEMICONDUCTOR PHOTODETECTORS

FIELD OF THE INVENTION

The present invention relates to pinholes for use as spatial filters in laser systems, and more particularly to thin-film pinholes that optionally include detectors for determining the position of the pinhole in the light beam and a mechanism to allow repositioning of the pinhole if it is out of alignment.

BACKGROUND OF THE INVENTION

Pinholes are used as a component in optical systems both as spatial filters to remove unwanted variations in light intensity across a light beam (typically if the light is generated from a laser) and as alignment aids to insure that incident light impinges on other optical elements at locations determined by the position of the pinhole. Thus, pinholes often must be placed in optical systems at precisely specified locations. A limitation in the usefulness of pinholes is that the exact position of prior art pinholes is difficult to establish initially and subsequently maintain from drifting, making systems which incorporate pinholes as either spatial filters or alignment aids difficult to align and prone to long-term performance degradation as the position of the pinhole drifts.

In a typical prior art pinhole component, the pinhole is laser-drilled through a metal foil. The prior art pinhole is therefore a passive device, incorporating no elements capable of measuring incident light intensity or position and further being incapable of straightforward modification to add position sensing elements. Typical metal foil thickness of 10–12 μm is used for these pinhole devices. However, pinholes smaller in diameter than 5 μm, are typically drilled through 6 μm thick foils. The use of thin metal foils results in fragile components which are prone to damage and warping during normal handling and use.

One embodiment of the present invention includes a thin-film position sensitive photodetector element that is integrated with a pinhole. There are two types of typical prior art position sensitive photodetector elements, each with possible variations on the technique for formation of the photodetector. One is a split-cell type position sensitive photodetector element that consists of multiple planar semiconductor junctions, adjacent but separated by gaps as small as 1 μm. In operation, when light is incident on the split-cell photodetector, different currents will be sensed in each of the semiconductor junctions of the split-cell. A second is a continuous-cell type of position sensitive photodetector element that consists of a single planar semiconductor junction with multiple contacts at its perimeter. In operation, when light is incident on the continuous-cell position sensitive photodetector, different currents will be sensed in each of the perimeter contacts depending on the relative distance between the centroid of the incident light and the perimeter contacts.

Each of the types of position sensitive photodetectors has a different practical application. The split-cell type is most useful for measuring small deviations in the location of an optical beam about a location centered on the gap between elements. The continuous-cell type is most useful for providing an approximately linear change in output signal with the changes in the position of a light beam. This is accomplished by noting the current difference from side to side of the entire photodetector element semiconductor junction. As compared to the spit-cell type, the continuous-cell type measures a larger range of incident light locations with less precision than the split-cell photodetector.

For either type of position sensitive photodetector, the semiconductor junctions are formed as metal-semiconductor junctions (Schottky-type photodetector), p-n semiconductor junctions, or p-i-n semiconductor junctions with the overall device operating as discussed above for any of the junction structures. In the formation of a metal-semiconductor junction, the semiconductor surface is coated with metal (typically less than 10 nm thick). In the p-n semiconductor junction, the manufacturing process introduces a layer, typically less than 1 μm thick, of p-type dopant into an n-type semiconductor substrate (or alternately n-type into p-type). In the p-i-n semiconductor junction, the typical manufacturing process is to epitaxially grow a layer (typically more than 10 μm thick) of lightly doped (near intrinsic) semiconductor on top of an n-type substrate, then introduce a layer of p-type dopant (typically less than 1 μm thick) into the epitaxial layer. In all of the cases described above, the substrate is derived from a semiconductor wafer, and the total device thickness is determined by the thickness of the semiconductor wafer with the wafer thickness being quite variable, i.e. typically 300 μm or more.

In summary, the prior art includes, independently, pinhole plates and position sensitive photodetectors. As discussed above, pinholes are manufactured in thin metal foils with the thin foil making the drilling process possible, and allowing for efficient pinhole operation, however, the pinhole foils are subject to mechanical damage and do not incorporate position sensitive elements. Also, as discussed above, the prior art includes position sensitive photodetectors that are fabricated in relatively thick substrates, hence they are not amenable to combination with the manufacture of a pinhole foil. What is needed is a pinhole and method of manufacture that overcomes the limitations of the presently available art and permits the integration of position sensitive photodetectors with pinhole assemblies. The present invention provides such a device and method of manufacture.

SUMMARY OF THE INVENTION

In accordance with the present invention there is shown a combined thin film pinhole and semiconductor photodetector array for use with an external electrical biasing source and current measurement devices in optical applications. The combined thin film pinhole and semiconductor photodetector array of the present invention includes a semiconductor substrate of a selected material that defines a pinhole therethrough of a selected size and shape with an array of a selected number of photodiodes formed on the substrate at selected locations around the perimeter of the pinhole.

The present invention also discloses a method of manufacture of a combined thin film pinhole and semiconductor photodetector array substrate for use with an external electrical biasing source and current measurement devices in optical applications. That method of manufacture includes a variety of steps including initially fabricating a semiconductor substrate having a first and a second semiconductor layer one on top of the other wherein the top layer is of a selected thickness as required for the optical application and each of the layers have a top surface and a bottom surface. A top protective layer is developed on the top surface of the top layer and a bottom protective layer on the bottom surface of bottom layer of the fabricated substrate. Also, selected windows are opened through the top protective layer through which a selected impurity is inserted, followed by the redevelopment of the top protective layer. Additionally, a window is opened through the bottom protective layer through which the bottom layer of the substrate is etched to form a cavity with the lateral extent of the cavity being determined by the crystal plane orientation of the bottom layer which intersect the third window and the bottom surface of said top layer. Further, contact windows are opened through the protective layer within each of the windows in the top layer to permit the deposition a selected conductive material on the substrate and into the contact windows to make external electrical connection to those buried layers. And to open another window through the top protective layer at a selected location above the location of the cavity to permit the etching of the pinhole through the substrate.

There is also disclosed an optical system that has a combined thin film pinhole and semiconductor photodetector array having on a semiconductor substrate with a pinhole defined therethrough, and an array of a selected number of photodiodes formed thereon at selected locations around the perimeter of the pinhole. The system further includes an electrical biasing source external to the substrate that is connected to the photodiodes on the substrate to back-bias each of the photodiodes, and a plurality of current measurement devices connected to the photodiodes to detect variations in individual currents as a result of variations in illumination of each of the photodiodes.

BRIEF DESCRIPTION OF THE DRAWINGS

FIG. 10c is an electrical schematic representation of the device of FIG. 10a.

DESCRIPTION OF THE PREFERRED EMBODIMENT

Figure 1:
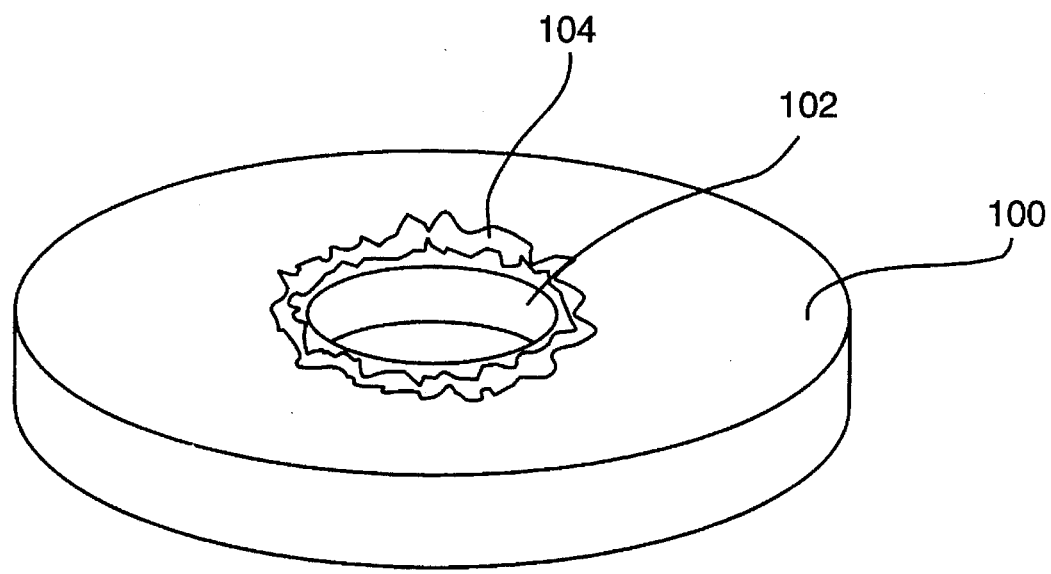
FIG. 1 is a perspective view of a typical prior art laser-drilled metal pinhole component.

FIG. 1 is a perspective view of a typical prior art laser-drilled pinhole component that is a substantially circular thin metal foil substrate 100. Pinhole 102 is typically created by exposing substrate 100 to intense laser radiation. As a result of the high temperatures induced in substrate 100 while drilling hole 102 therethrough, substrate 100 unavoidably melts in that vicinity, resulting in ragged edges 104 that surround pinhole 102.

Figure 2A:
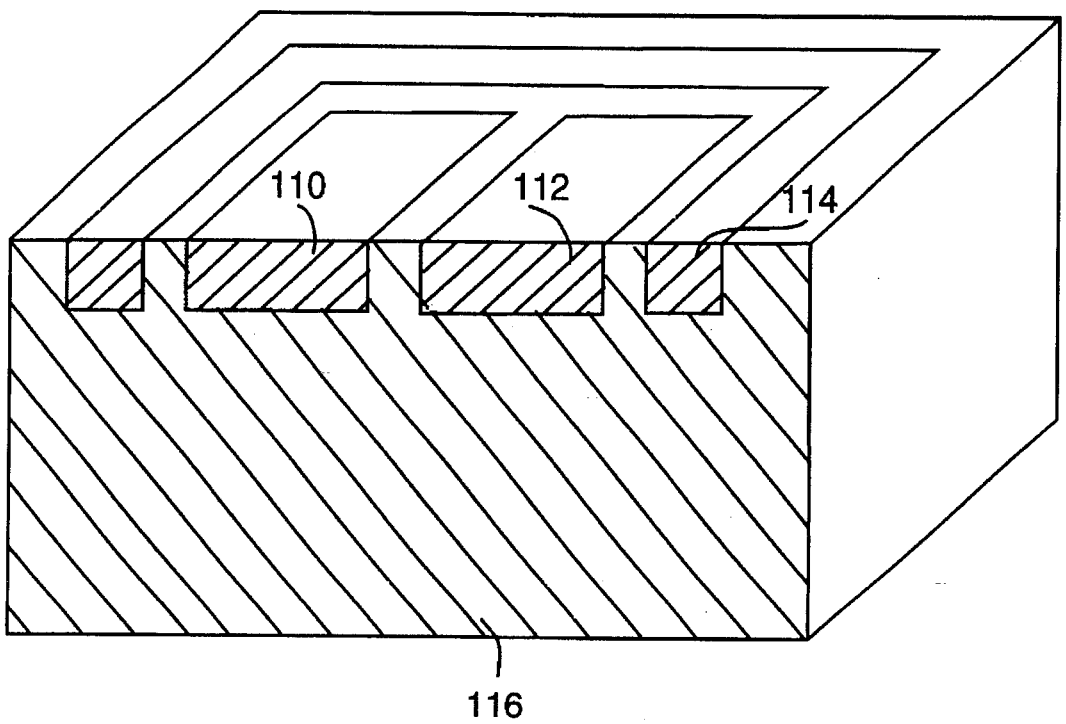
FIGS. 2a and 2b show cross-sectional projections of the two typical prior art position sensitive photodetectors.
Figure 2B:
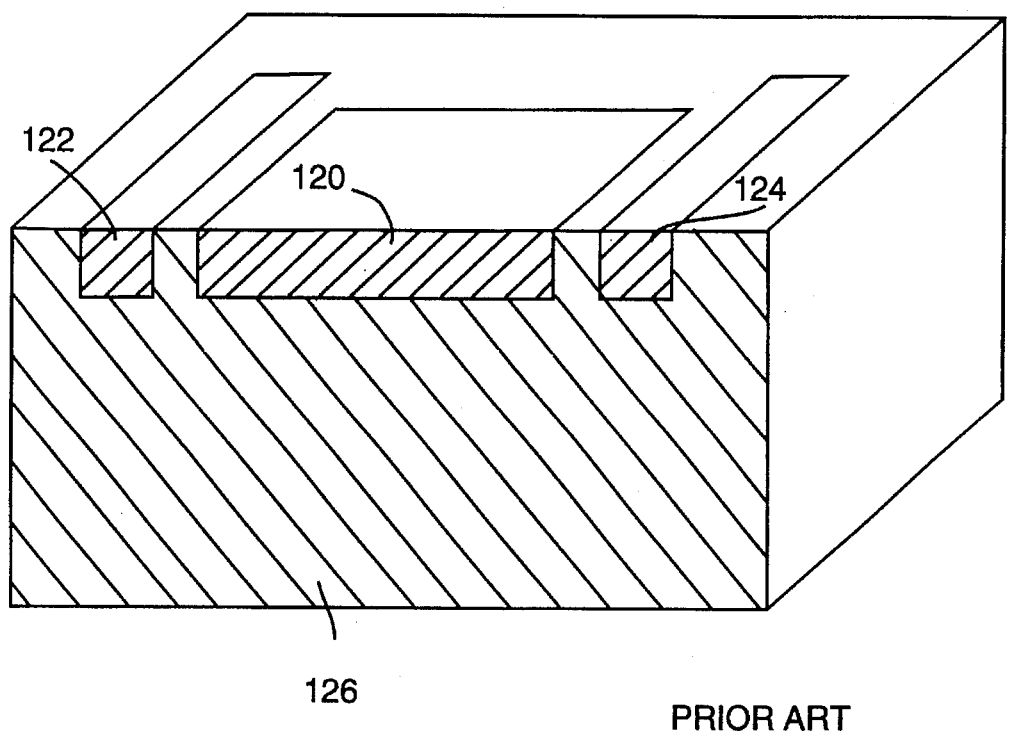

FIGS. 2a and 2b show cross-sectional projections of typical prior art position sensitive photodetectors. The device of FIG. 2a is a split-cell photodetector with separate p+ doping type anode areas 110 and 112 that each respond to incident optical beams on the left or right of a dividing line formed between anodes 110 and 112. In this configuration, anodes 110 and 112 have a shared cathode 114 in an n-type semiconductor substrate 116. The device of FIG. 2b is a typical prior art continuous-type position sensitive photodetector with a single anode 120 and left and right cathode sections 122 and 124 in a common substrate 126.

The following description discusses the structure of a pinhole component of the present invention with monolithically integrated position-sensing photodetector element as a semiconductor device hereinafter referred to as Position Sensitive Pinhole (PSP). The steps to be described of fabricating the position-sensing photodetector surrounding a pinhole etched through the semiconductor wafer can be performed in different orders of various steps. It is also possible to reorder the many sub-steps of many of the steps to achieve the same result. Many of the described manufacturing steps additionally may be replaced by essentially equivalent alternatives without significantly changing the device structure. However, to maximize the component yield from the substrate, and minimize the manufacturing costs of each substrate, it is desirable to maintain planar top and bottom surfaces of the substrate that are pinhole free through as much of the manufacturing process as possible. Therefore, the preferred order, given today' technology, is to complete the fabrication steps for the position-sensing photodetector element of the finished device before a back cavity is etched, and subsequently, the pinhole etched through the thinned portion of the substrate.

The following discussion illustrates a particular implementation of a pinhole integrated with a quadrant split-cell photodetector by the preferred technique. At several steps in the manufacturing sequence, alternative manufacturing processes are mentioned, however, many of the other steps may also be performed by alternative processes. The type of position sensitive photodetector may be selected from either of the prior art types, i.e. split-cell types (of which a quadrant cell is one example) and continuous-cell types with simple modifications to the described technique, thus making it possible to integrate any number or type of desired position sensing elements with the thin film pinhole of the present invention. That flexibility makes it possible to simultaneously implement a position sensitive photodetector variation that incorporates both of the continuous and split-cell types. It should also be noted that the thicknesses of the various layers in the accompanying figures are not to scale and have been drawn as they have to illustrate the steps in the manufacturing process with one skilled in the art being in a position to realize the actual thickness of each such layer.

Figure 3:
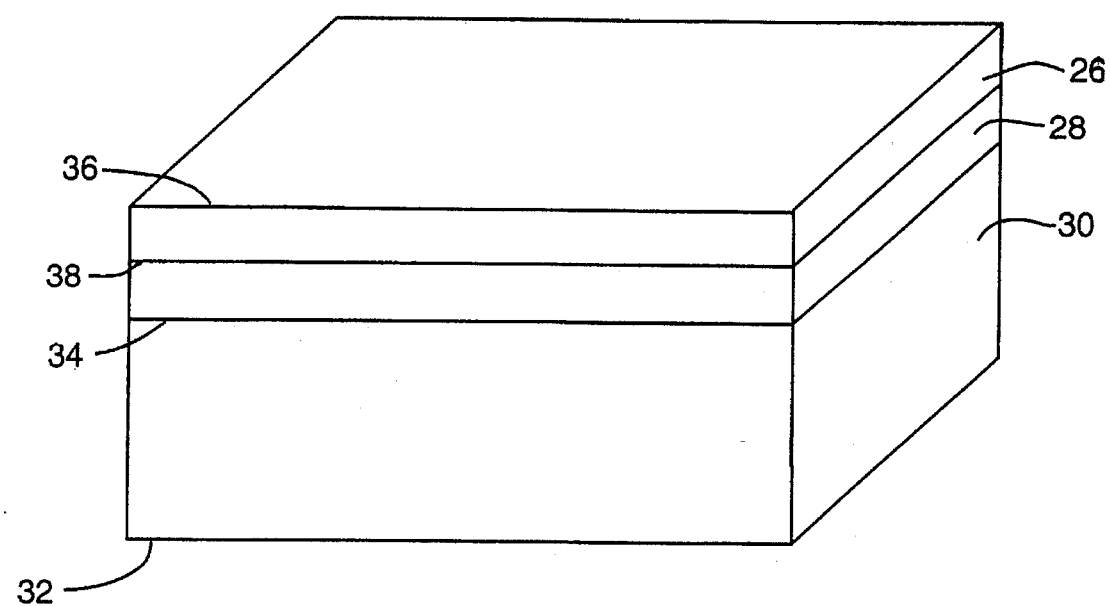
FIG. 3 shows a cross-sectional projection of a bonded compound semiconductor substrate used in the fabrication of the present invention.

FIG. 3 illustrates the starting point in the fabrication of each of the embodiments of the present invention. As shown in FIG. 3 there is a compound semiconductor substrate consisting of top and bottom semiconductor wafers 26 and 30 that are bonded to each other via an intermediate bonding layer 28 (e.g. a thermally grown silicon dioxide layer). The preferred bonding technique is a widely known thermal silicon bonding technique. Alternatively, the substrate of FIG. 3 can be created by an oxygen-implantation and epitaxial growth technique known as Simox. To facilitate the etch orientations of later steps, both of wafers 26 and 30 will typically be selected of (100) crystalline orientation with wafer 26 additionally typically being a high resistivity n− conductivity type silicon. Wafer 30 can be of standard available thickness, typically 525 μm for four-inch diameter silicon wafers. Wafer 26 should be thinned for optimal optical performance of the pinhole, and may be thinned after thermal bonding to between 1 and 10 μm. The compound substrate of FIG. 3 has four semiconductor surfaces, the top-wafer-top-surface 36, the top-wafer-bottom-surface 38, the bottom-wafer-top-surface 34, and the bottom-wafer-bottom surface 32.

From this point through the balance of the discussion of the fabrication steps of a PSP of the present invention it will be assumed that the finished device will have four identical sections, or quadrants. However, the number of sections that the finished device of the present invention may have can be any number, with the minimum number of sections being one, The number of sections selected is dictated by the overall accuracy desired in the determination of the position of a light beam relative to the pinhole of the finished device. In the other embodiments of the present invention the number of sections of the finished device will also be determined by how much flexibility is desired in the ability to reposition the pinhole relative to the light beam.

Figure 4A:
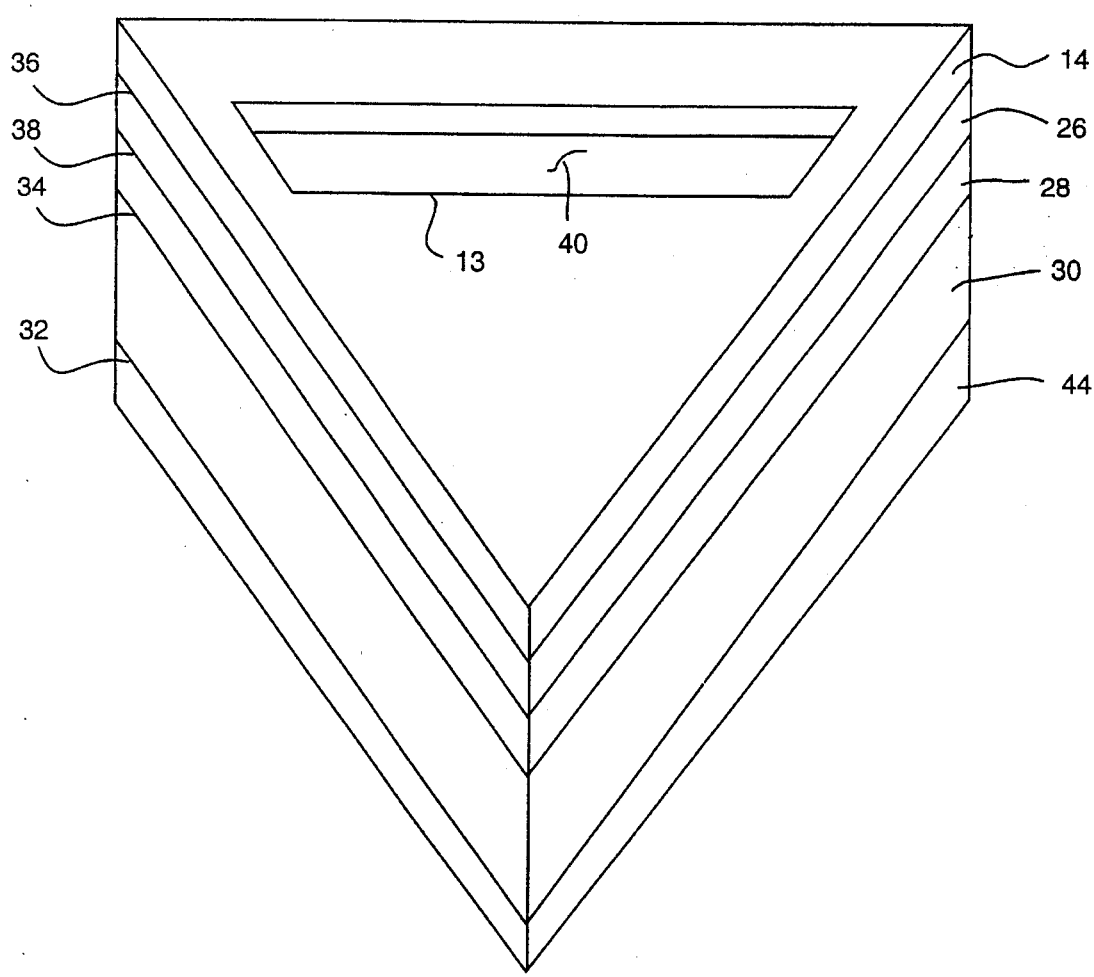
FIGS. 4a and 4b show different cross-sectional projections of a quadrant of the semiconductor substrate of FIG. 3 after introduction of an n+ conductivity layer.
Figure 4B:
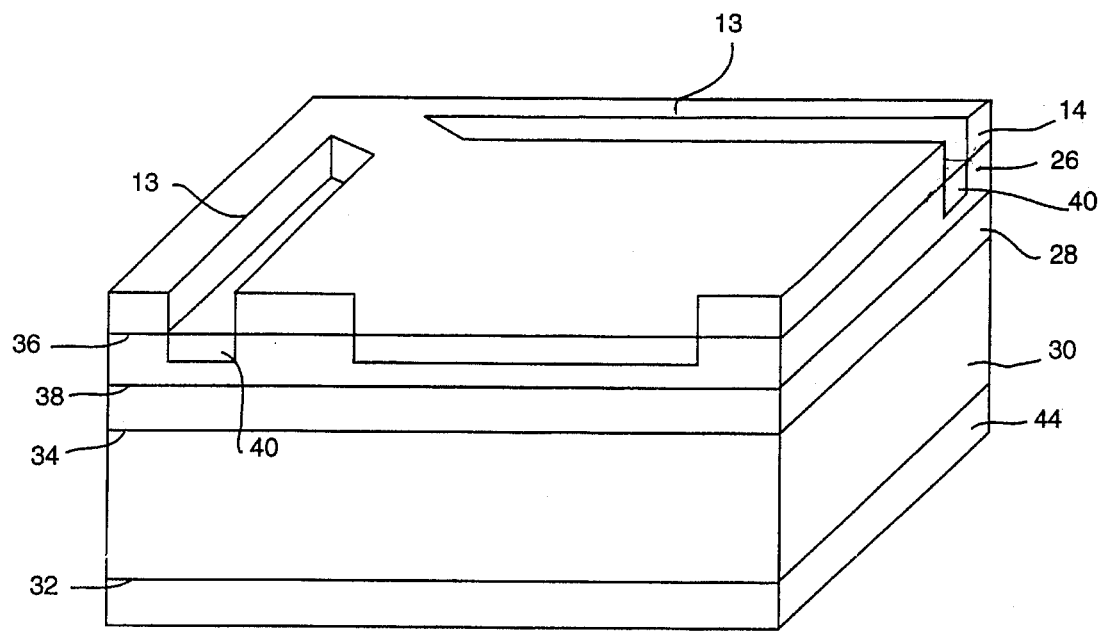

FIGS. 4a and 4b each show a different cross-sectional projection of the compound semiconductor substrate from FIG. 3 after growth or deposition of a top protective layer 14 (typically SiO2) on top-wafer-top-surface 36 and a bottom protective layer 44 on bottom-wafer-bottom-surface 32. A window 13 is then etched into top protective layer 14 using known photomasking and etching techniques. Window 13 and top protective layer 14 determine the location of n+ conductivity layer 40, formed by introduction of n− type impurity (typically phosphorous) into top-wafer-top-surface 36 of top wafer 26 by known processes (e.g. dopant diffusion or ion implantation).

Figure 5A:
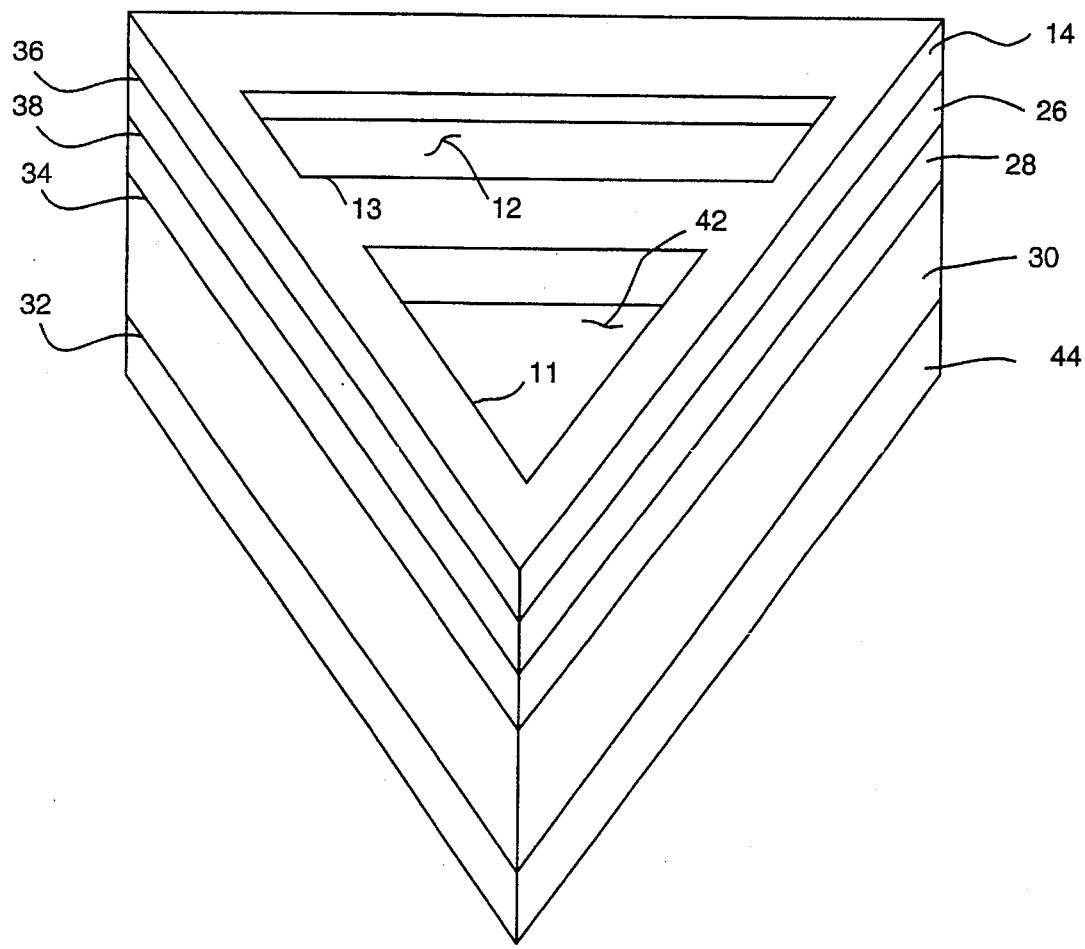
FIGS. 5a and 5b show the cross-sectional projections of a portion of the semiconductor substrate of FIGS. 4a and 4b, respectively, after introduction of the p+ conductivity layer to form a photodetector junction.
Figure 5B:
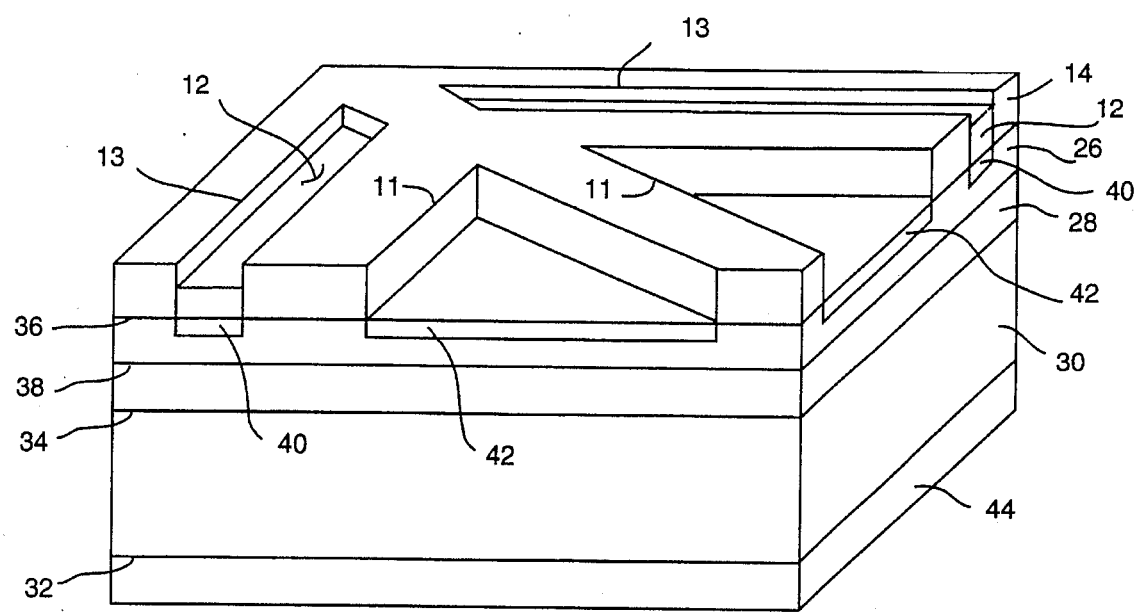

FIGS. 5a and 5b show the same cross-sectional projections of the compound semiconductor substrate as in FIGS. 4a and 4b, respectively, after a new top protective layer 12 is re-grown or re-deposited over the shallow diffused n+ conductivity layer 40 within window 13, and windows 11 are etched into the top protective layer 14 using known photomasking and etching techniques. Window 11 and top protective layers 14 and 12 determine the location of p+ conductivity layer 42, formed by introduction of p-type impurity (typically boron) into top-wafer-top-surface 36 of top wafer 26 by known processes (e.g. dopant diffusion or ion implantation). This p+ conductivity layer 42 defines a position sensitive photodetector element.

Figure 6A:
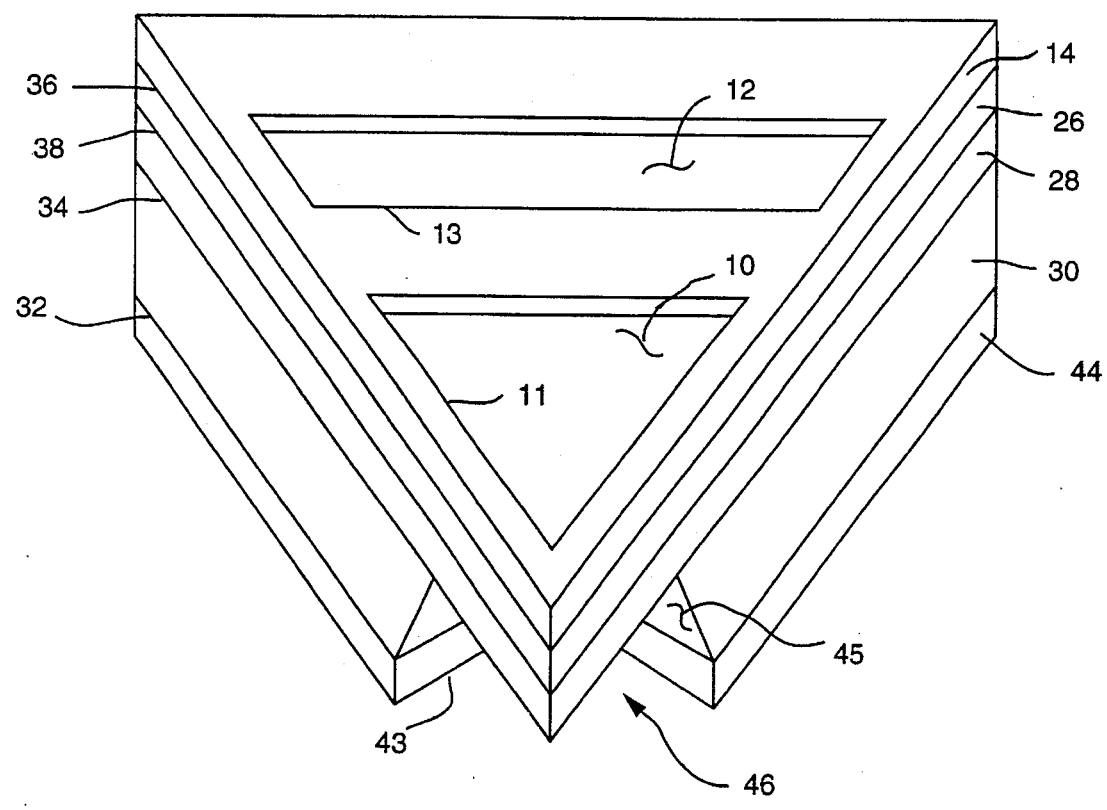
FIGS. 6a and 6b show cross-sectional projections of a portion of the semiconductor substrate of FIGS. 5a and 5b, respectively, after etching of a back-side cavity.
Figure 6B:
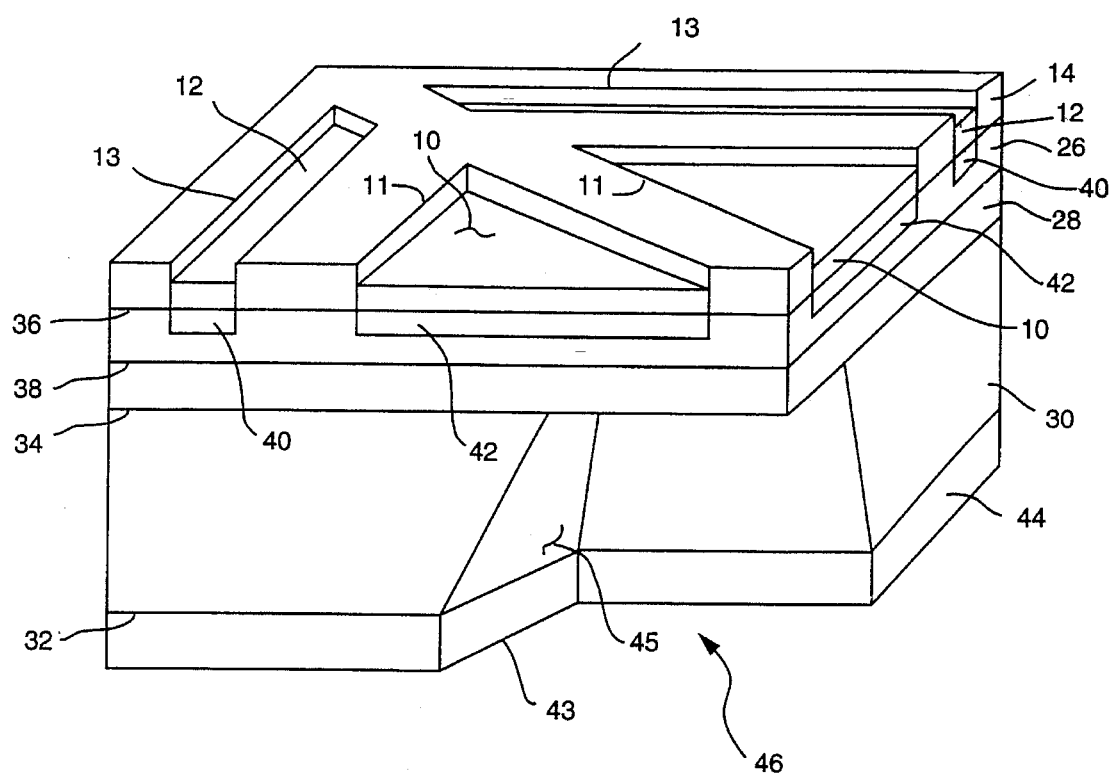

FIGS. 6a and 6b show the cross-sectional projections of the compound semiconductor substrate of FIGS. 5a and 5b after a top protective layer is re-grown or re-deposited in windows 11, creating a new protective layer 10 over the shallow ion implanted p+ conductivity layer 42. Subsequently, a window 43 is etched through bottom protective layer 44 to expose bottom-wafer-bottom-surface 32 of wafer 30 using known chemical etch techniques. Wafer 30 is then etched using known chemical etch techniques with bottom protective layer 44 acting as an etch mask and the cavity boundary 45 typically defined by the (111) crystal planes of bottom semiconductor wafer 30 which intersect the etch mask window 43. The back cavity 46 etch consumes the entire thickness of the bottom wafer 30, and is easily prevented from accidental etching top wafer 26 by choosing a chemical solution which preferentially etches semiconductor wafer 30 and not interface layer 28. For silicon semiconductor wafers and SiO2 interface layers, many chemical solutions with the above described etch properties exist, most widely used are potassium hydroxide (KOH), ethylene diamine pyrocatechol (EDP), and tetramethyl ammonium hydroxide (TMAH). Alternative manufacturing techniques where a bonding layer 28 is not used in the compound substrate can use electrochemical etch stop, dopant selective etching, or controlled, timed etching from the bottom surface of any common semiconductor wafer.

Figure 7A:
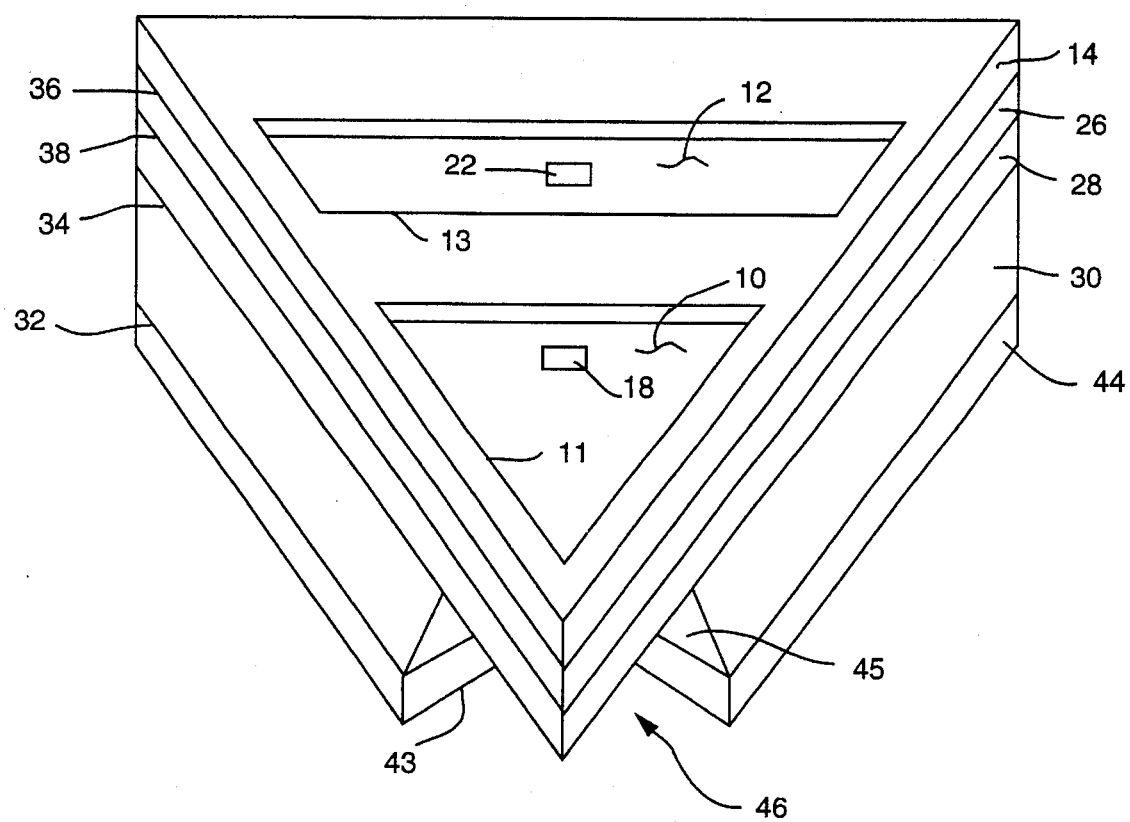
FIGS. 7a and 7b show cross-sectional projections of a portion of the semiconductor substrate of FIGS. 6a and 6b, respectively, after etching of contact windows.
Figure 7B:
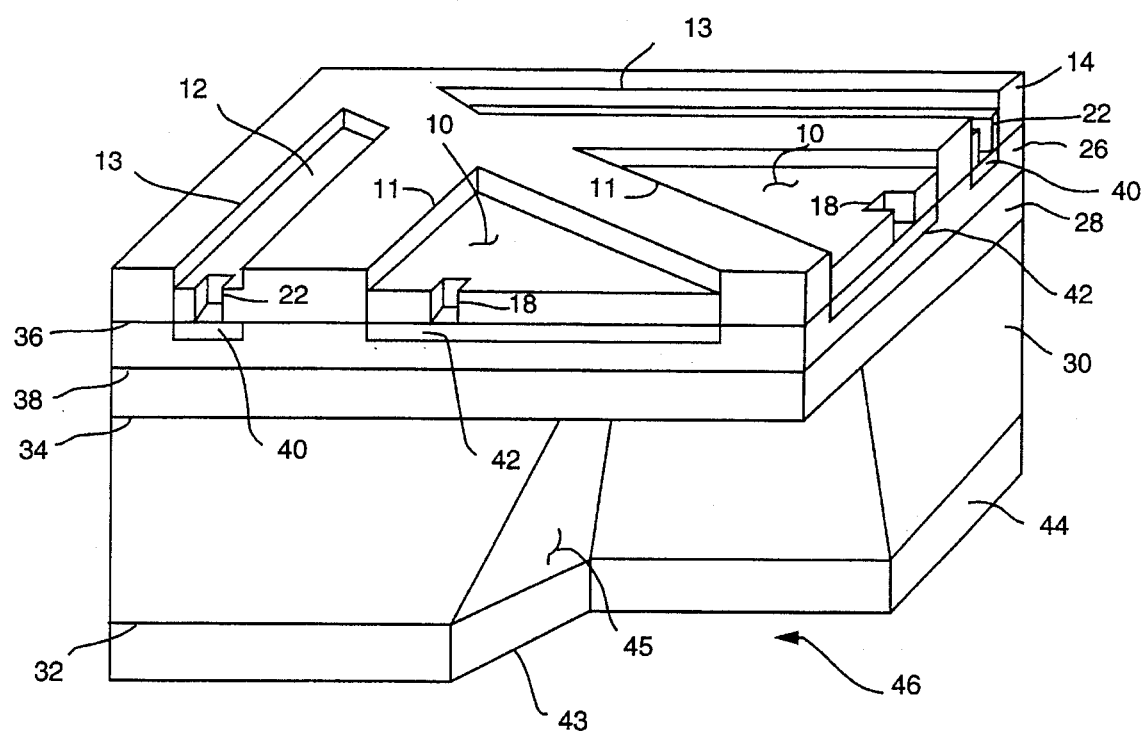

FIGS. 7a and 7b show the cross-sectional projections of the compound semiconductor substrate from FIGS. 6a and 6b when protective layer 12 in window 13 is photomasked and etched to create a contact window 22 to the top surface of n+ conductivity layer 40, and protective layer 10 in windows 11 is photomasked and etched to create a contact window 18 to the top surface of p+ conductivity layer 42. Contact windows 18 and 22 are defined on a single photomask referred to as the contact window photomask.

Figure 8A:
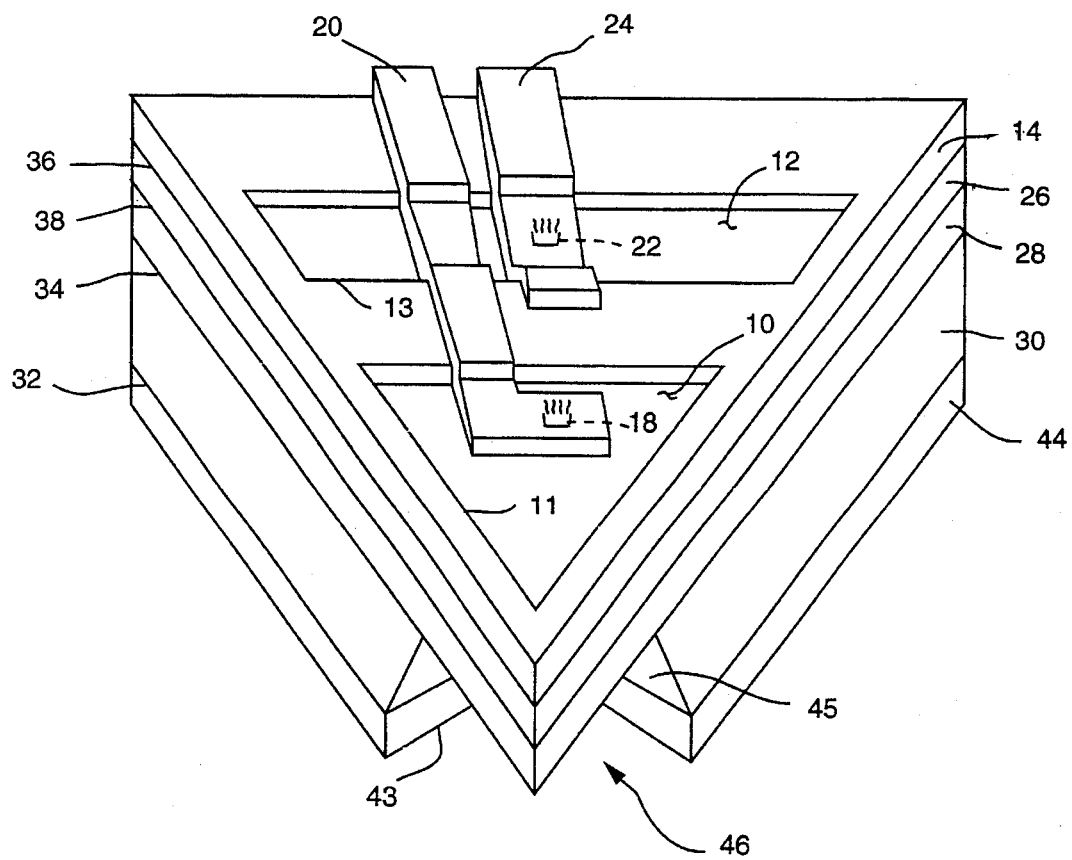
FIGS. 8a and 8b show cross-sectional projections of a portion of the semiconductor substrate of FIGS. 7a and 7b, respectively, after deposition and patterning of a metal layer.
Figure 8B:
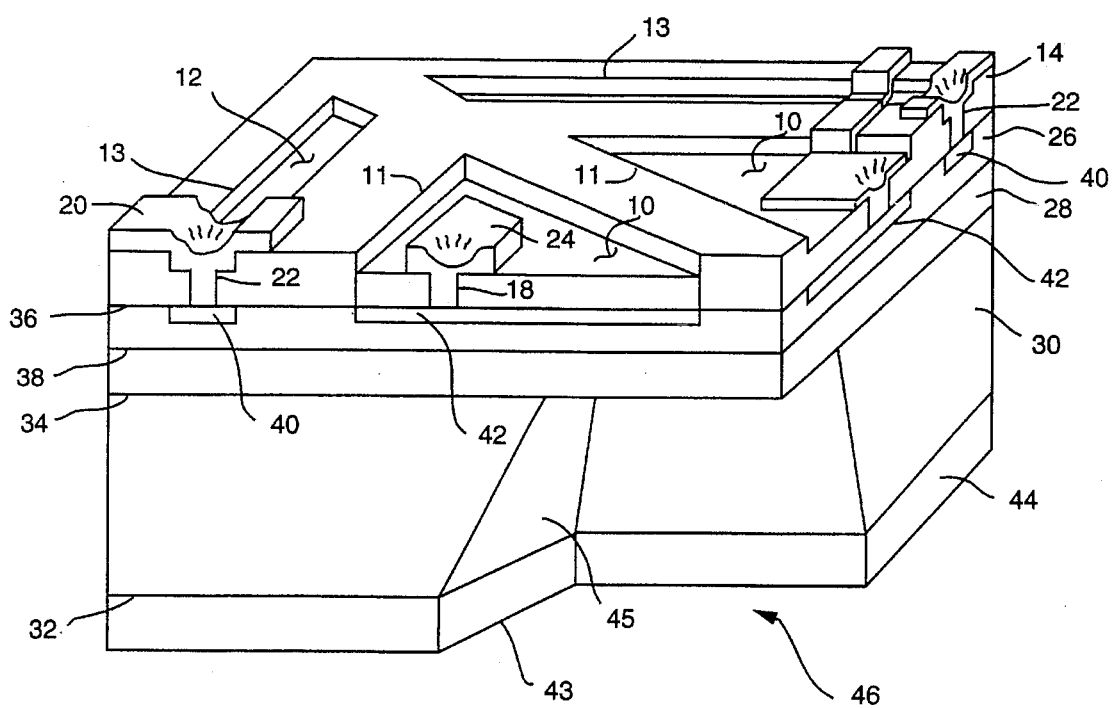

FIGS. 8a and 8b show the cross-sectional projections of the compound semiconductor substrate from FIGS. 7a and 7b after a metal (typically aluminum) is deposited by known evaporation or sputtering techniques over the protective layers 10, 12, and 14, and into the contact windows 18 and 22. The metal is then photomasked and etched to leave substrate contact traces 24 and photodetector contact traces 20. The photomask defining the contact traces 20 and 24 is referred to as the metal etch photomask.

Figure 9:
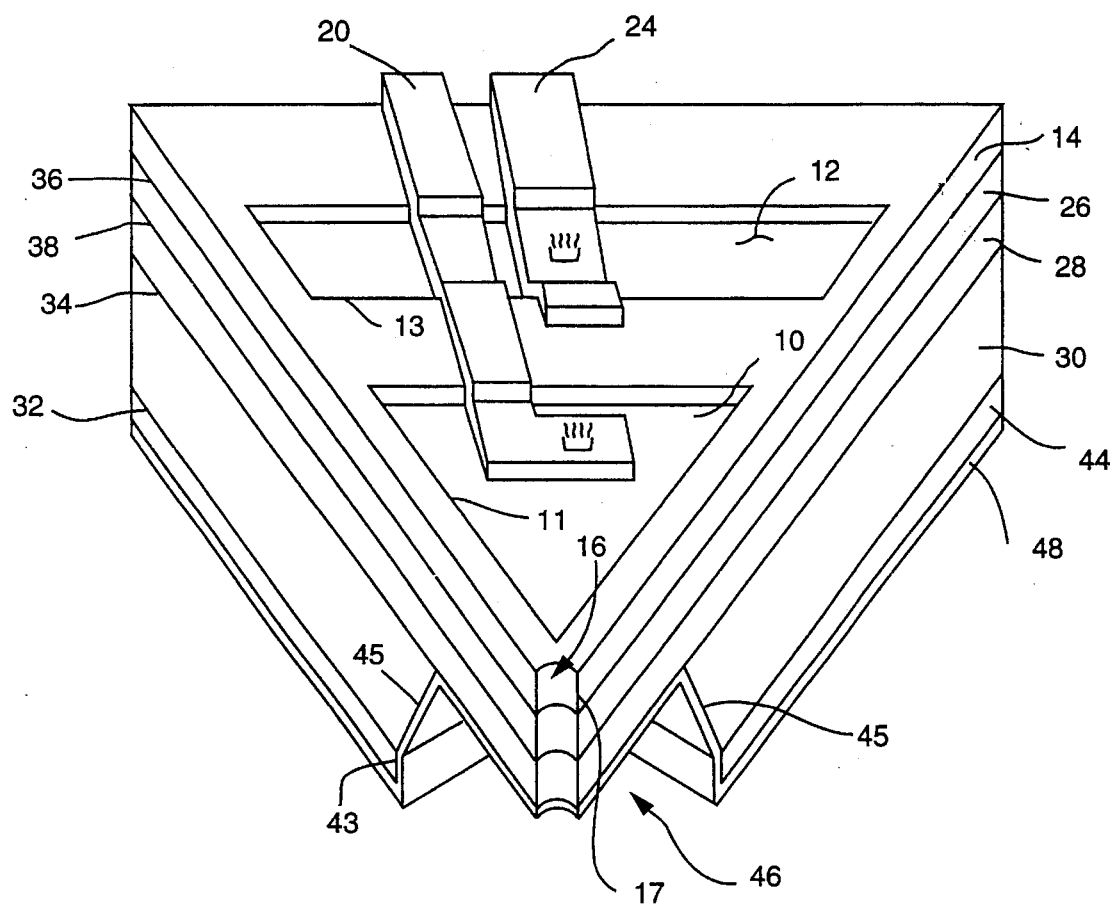
FIG. 9 shows cross-sectional projections of a portion of the semiconductor substrate of FIG. 8a after pinhole etching and optional back-side metallization.

FIG. 9 shows the cross-sectional projections of the compound semiconductor substrate from FIG. 8a after a pinhole 16 is etched through the protective layer 14, the top wafer 26, and the intermediate bonding layer 28 to cavity 46 by known masking and chemical etching techniques. The extent and location of pinhole 16 are controlled by photomasking the entire top surface of the substrate and through that photomask, and through protective layer 14, creating window 17. The shape of the side-walls of pinhole 16 through each layer is determined by the etch technique selected. A typical choice of isotropic etch, with directionality normal to the etched surface 36 will result in a pinhole shape closely described by the shape of window 17. Example etch techniques for pinhole 16 are C12 or SF6 containing plasma etch recipes, and are widely used in DRAM capacitor etching. Alternative choices of crystal orientation selective etchants, such as those described in conjunction with the back cavity 46 etch may be used to create square or rectangular pinholes, determined by the intersections of the (111) crystal planes of top wafer 26 and the etch window 17. Another alternative pinhole etch is anisotropic semiconductor etchants (e.g. Hydrofluoric-Nitric-Acetic acid mix) which results in pinhole 16 having sloped sides. After pinhole etch, a metal layer 48 (typically aluminum) may optionally be evaporated on the overall bottom surface of the completed substrate, although metal layer 48 is not required for the electrical operation of the device. Metal layer 48 will, however, enhance photodetector response to long wavelength light, and reduce unwanted transmission of light through the thin top wafer 26.

Figure 10A:
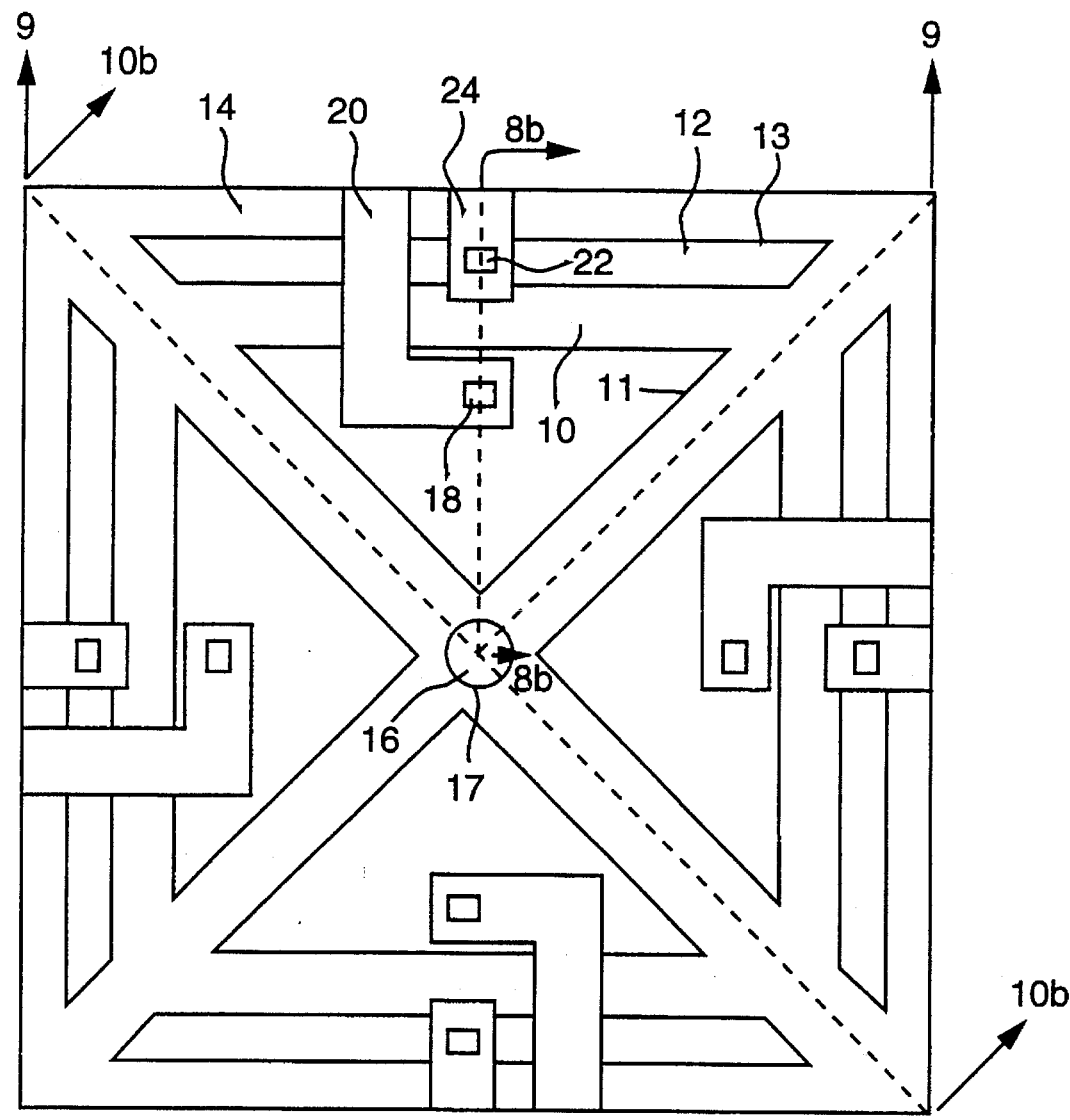
FIG. 10a shows a top plan view of a completed PSP component of the preferred embodiment, made up of 4 symmetric quadrants.

FIG. 10a shows a top plan view of the complete semiconductor substrate including four quadrants of the configuration shown in FIG. 9 after PSP fabrication has been completed. The broken line segments between arrows marked 9—9 indicate the quartering cross-section used for the cross-section projections of a single quadrant in FIGS. 4a, 5a, 6a, 7a, 8a, 9, 11, and 12. Similarly, the broken line segment between arrows marked 8b—8b indicate the cross-section axis used for the cross-section projections of FIGS. 4b, 5b, 6b, 7b and 8b. From FIG. 10a it can be seen that the regions that divide each of the quadrants are portions of the connected top protective layer 14.

After the completed PSP component is separated from the remainder of the substrate, that portion of the bottom wafer which was not removed in the etching of the cavity now forms a solid frame surrounding the membrane of the top wafer above the etched cavity.

Figure 10B:
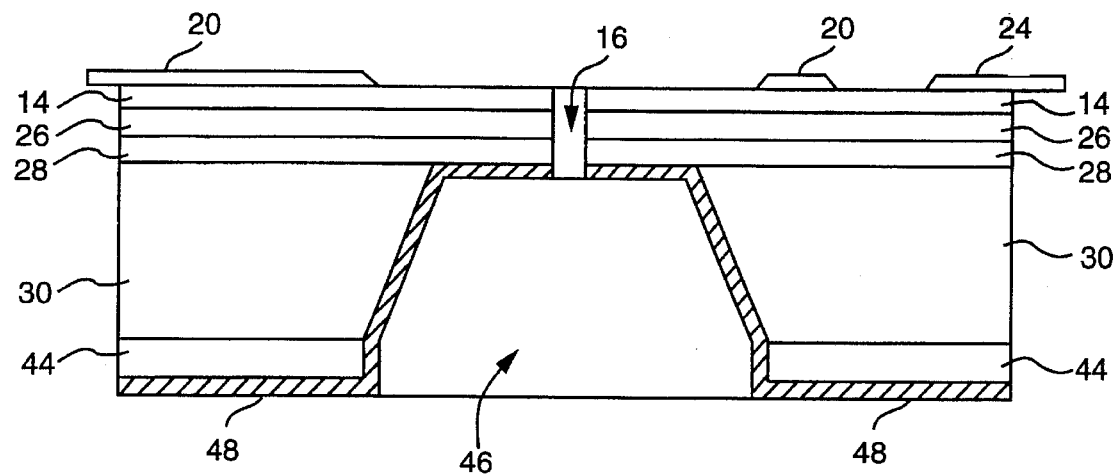
FIG. 10b is a cross-sectional view of the substrate shown in FIG. 10a taken along broken line 10b—10b.

FIG. 10b shows a cross-sectional view of the device of FIG. 10a with the cross-section dividing the device in half through pinhole 16 and top protective layer 14 as viewed from the top of the substrate as in FIG. 10a. This view is provided to show the physical relationship between adjacent quadrants of the finished device.

The position sensitive photodetector embodiment shown in FIG. 10a has four anodes (a split-cell configuration with four separate anodes forming four separate photodiodes) defined by the four p+ conductivity areas 42 (under protective layer 10). Additionally, the current embodiment has multiple cathode connections defined by the four n+ conductivity areas 40 (under protective layer 12), connected to a single cathode defined by the top semiconductor wafer 26, as typical in a continuous-cell configuration. This embodiment of the position sensitive photodetector is a hybrid of split-cell and continuous-cell types, because the defining feature of a split-cell configuration is to have multiple anodes, while the defining feature of a continuous-cell configuration is to have multiple connections to a single cathode.

For the present embodiment, the operating principle is selectable by user applied biasing conditions. With simple modifications to the photomasks defining the p+ conductivity areas or the n+ conductivity areas, the position sensitive photodetector element may be manufactured to be of typical split-cell or continuous-cell type.

Figure 10C:
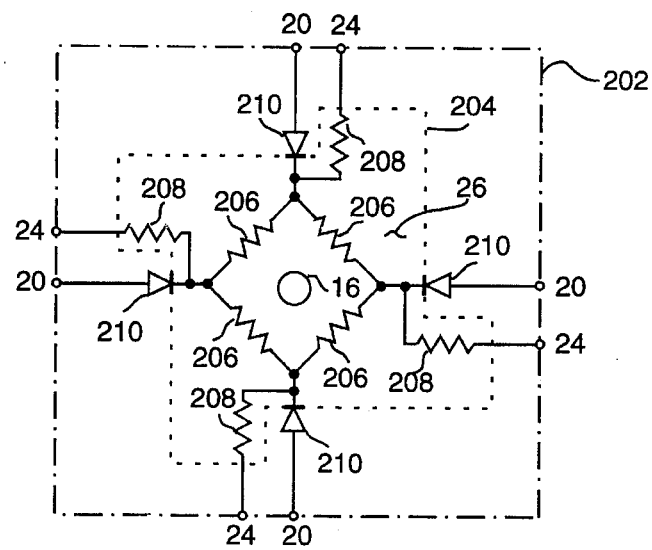

FIG. 10c schematically illustrates the electronic characteristics of the quad PSP device of FIG. 10a with the physical structures pictured in previous figures replaced here by their electrical circuit symbols. The dot-dashed box 202 is the physical outline of a PSP chip of the present embodiment. The individual photodiode cells 210 are shown surrounding the etched pinhole 16 with separate photodetector contact traces 20 and separate substrate contact traces 24 to each of the four individual photodiode cells 210 around the circumference of the chip. The physical outline of top semiconductor wafer 26 is shown in this schematic representation as dotted polygon 204, since top semiconductor wafer 26 forms a common cathode between all four photodiode cells 210, provides a resistance network that is connected to each of the cathodes of photodiodes 210. That resistive network is shown having two sections: a bridge of equivalent resistors 206 surrounding pinhole 16 with a each node of that bridge connected to the cathode of a different one of the four photodiodes 210; and individual resistive paths 208 between the individual cathodes of the four photodiodes 210 of conductive wafer 26 and the n+ conductivity layer 40 to which substrate contact traces 24 are connecting and outward around the periphery of the substrate.

As discussed with respect to the prior art, there are typical two operating modes of position sensitive photodetector elements, split-cell operation and continuous-cell operation, either of which can be obtained with the PSP of the embodiment of FIG. 10c. Additionally, if a mixed operation of both split-cell and continuous-cell were desired, that too is possible with the PSP embodiment of FIG. 10c since the necessary interconnections between the anodes or the cathodes of photodiodes 210 for the operational modes are not included on the substrate.

Figure 10D:
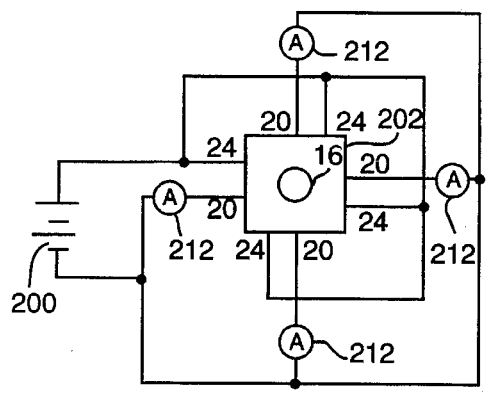
FIG. 10d is an electrical schematic representation of the device of FIG. 10c under split-cell operating mode.
Figure 10E:
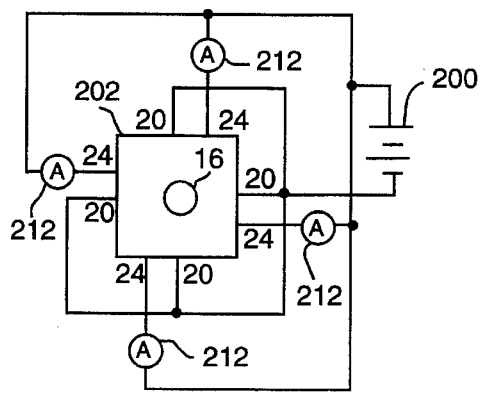
FIG. 10e is an electrical schematic representation of the device of FIG. 10c under continuous-cell operating mode.

FIGS. 10d and 10e are provided to illustrate the split-cell and continuous-cell operational modes, respectively, for the quad-PSP of FIG. 10c.

In FIG. 10d a simplified schematic of the PSP substrate 202 of FIG. 10c is shown as a block with pinhole 16 through the center and the four pairs photodetector and substrate contact traces 20 and 24, respectively, around the perimeter of substrate 202. To implement the split-cell operational mode, as shown here, each of the four substrate contact traces 24 are shorted together and connected to the positive terminal of an applied voltage source 200. Each of photodetector contact traces 20, on the other hand, are serially connected through individual current measurement devices 212 to the negative terminal of applied voltage source 200 thus reverse biasing each of photodiodes 210.

In this configuration, the measured current in each of the current measurement devices 212 is therefore equal to the current through the corresponding photodiode cell 210 to which it is connected. In this, the split-cell operating mode, each photodiode cell 210 generates a current proportional to the incident light power received by that cell, and from the individual currents measured by current measurement devices 212 each current can be compared to each other current to determine the position of the light beam relative to each of the photodiode cells. For example, if the light beam is at the top of pinhole 16, the photodiode that is located adjacent that point will conduct the largest current, the photodiodes on either side of pinhole 16 will conduct the same current level which is less than the current level flowing in the top photodiode, and the photodiode adjacent the bottom of pinhole 16 will conduct the least current since it furthest from the light beam. Similarly if the light beam is intermediate two photodiodes, those two photodiodes will conduct the highest currents with the current conducted by each being proportional to the distance to the light beam, and the other two photodiodes will conduct less current in proportion to the distance from the light beam. Thus, through a calibration of the various currents in each of the diodes the exact position of the light beam with respect to the center of pinhole 16 can be determined. It should be noted at this point in the discussion that the number of photodiodes that can be included in a device of the present invention can be any number, and that the accuracy by which the position of the light beam can be determined is directly proportional to the number of photodiodes surrounding pinhole 16.

FIG. 10e illustrates the biassing of the PSP embodiment of the present invention in the continuous-cell mode. Here, as in FIG. 10d, a simplified schematic of the PSP substrate 202 of FIG. 10c is shown as a block with pinhole 16 through the center and the four pairs photodetector and substrate contact traces 20 and 24, respectively, around the perimeter of substrate 202. To implement the continuous-cell operational mode each of the four photodetector contact traces 20 are shorted together and connected to the negative terminal of an applied voltage source 200. Each of substrate contact traces 24, on the other hand, are serially connected through individual current measurement devices 212 to the positive terminal of applied voltage source 200. Connected in this way, each of the four photodiodes 210 are reverse biased by bias voltage 200, as they were in the split-cell operating mode illustrated in FIG. 10d.

Connected in this way, as can be seen by referring to both FIG. 10e and FIG. 10c, the top semiconductor wafer 26 forms an electrically resistive paths 206 and 208 between current measurement devices 212 and the photodiode cell cathodes. Thus, generated current divides between the cathode connections in inverse proportion to the resistance of each path, i.e. the current flow is greater the lower the resistance of the path.

Continuing that thought, the greater the intensity of the light incident on a photodetector 210, the more current that flows therethrough, thus, in resistive terms, causing the photodiode to appear to have a lowered resistance. When viewing only one quadrant of the schematic circuit of FIG. 10c it can be seen that photodiode 210, resistor 208 and current measurement device 212 are serially connected across applied voltage source 200. Accordingly, the voltage at the cathode of photodiode 210 increases causing current to flow to the other photodiodes 210 and reduces the current that flows through each of them. That influence by one photodiode on each of the others is also influenced by the intensity of the light incident on the other photodiodes 210 as a result of the resistive bridge of resistors 206. Therefore, observation of the current difference between each of the anode connections leads to a conclusion about the relative location of the centroid of the incident optical power and the anode connections. In this continuous-cell scheme, the current difference observed as above results not only in information about the direction of offset between the center of pinhole 16 and the incident light location, but also in information about the offset distance from each of photodiodes 210.

Using either the split-cell or the continuous-cell operating mode, the photodiode cell 210 Generating the greatest current can be concluded to be that one which is receiving the greatest light power. Such a conclusion made, a typical operating decision would be to mechanically reposition the PSP by moving it in the direction of that photodiode cell which is receiving the greatest light power. If the measurement and repositioning sequence is continually repeated, eventually the PSP will be positioned so that the incident optical power passes through the center of pinhole 16. In operating applications either as a beam-aligned or a spatial filter, the use of biasing and measurement circuitry and a mechanical repositioning technique allows the PSP to be aligned concentric with a light beam.

The hybrid nature of the PSP position sensitive photodetector cells of the present invention described above results in a position sensitive photodetector which can be switched at will from the high-certainty offset direction finding operation of a split-cell to the high-accuracy offset distance measurement operation of a continuous-cell. With flexible biasing circuitry, the results of both operating modes can be obtained with reconfiguration switching circuits that permit the switching back and forth between the two modes in rapid succession. Such an operating mode results in the generation of more information of the relative locations of the photodetector and the incident light than possible with either the fixed split-cell or the fixed continuous-cell types of position sensitive photodetectors alone.

The second embodiment of the present invention is a Movable PSP (MPSP) to facilitate the positioning of the pinhole either initially, or during operation when a positional shift of the pinhole has occurred. The process steps to produce a device of this type is similar to that of the PSP. To illustrate the process for production of an MPSP is discussed by using the cross-sectional projection of a single quadrant of device at different stages of the production. As with the PSP, it should be remembered that the use of a quadrant structure is for illustrative purposes only, and that the finished device may have as many sectors as desired.

Figure 11A:
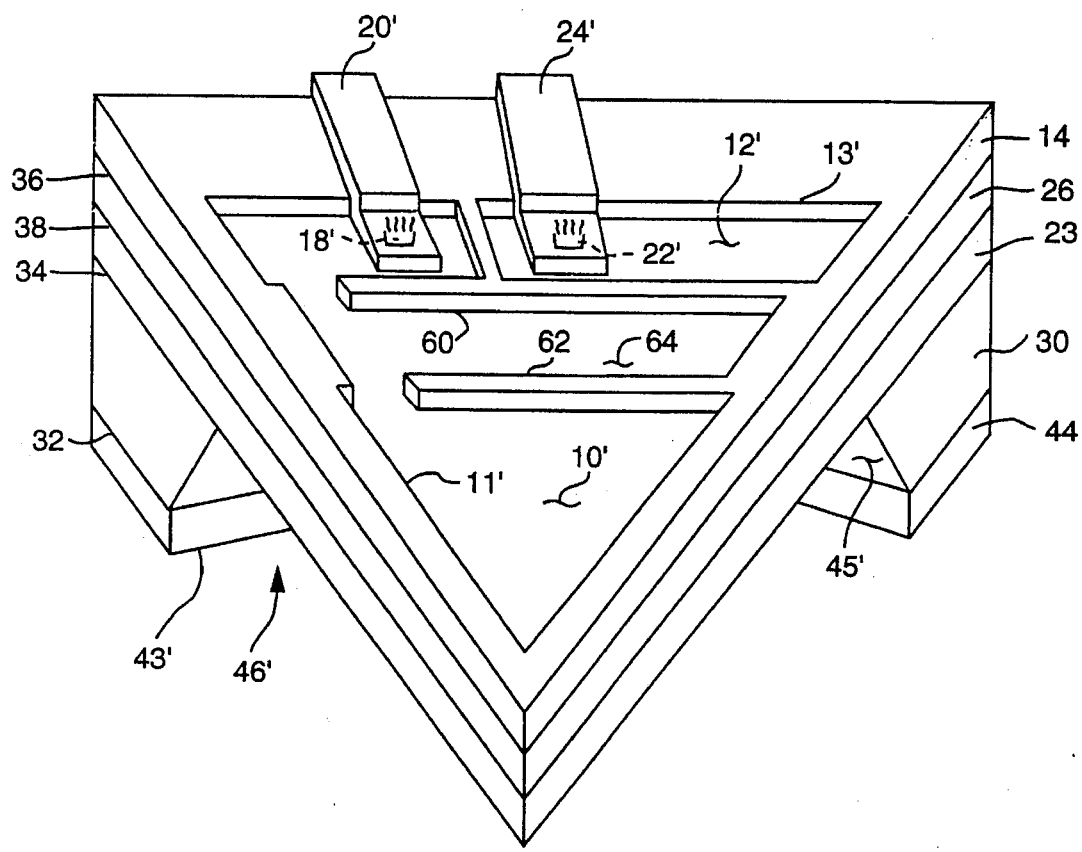
FIGS. 11a–11b are cross-sectional projections of the semiconductor substrate of FIGS. 4a and 4b as modified to form a movable position sensitive pinhole (MPSP).

Referring first to FIG. 11a there is shown a cross-sectional projection of a single quadrant of a partially completed Movable PSP (MPSP) embodiment. To reach this point, the sequence of manufacturing steps leading to FIG. 11a is the same as previously described for manufacture of a PSP. Comparing FIG. 11a with FIG. 4a, window 13' compares to window 13 with an n+ conductivity layer 40' beneath new top protective layer 12'. Similarly, when FIG. 11a is compared to FIG. 5a, window 11' compares to window 11 with a p+ conductivity layer 42' beneath new protective layer 10'.

In window 11', two of the window defining features 60 and 62 define a region 64 between them where spring structure 50 (see FIG. 11b) is to be formed.

Next, by comparing FIGS. 11a and 6a, it can be seen that here that etch mask window 43' has been sized and shaped so that the etched cavity boundary 45' in the bottom of the device is substantially aligned with window defining feature 60 on the top of the device. The creation of cavity 46' is created in the same way described for the creation of cavity 46 for the PSP embodiment. Then in the same way as described in relation to FIGS. 7a and 8a, contact windows 18' and 22' are opened in the regions within windows 10' and 12', followed by the metalization of photodetector contact trace 20' and substrate contact trace 24'.

Figure 11B:
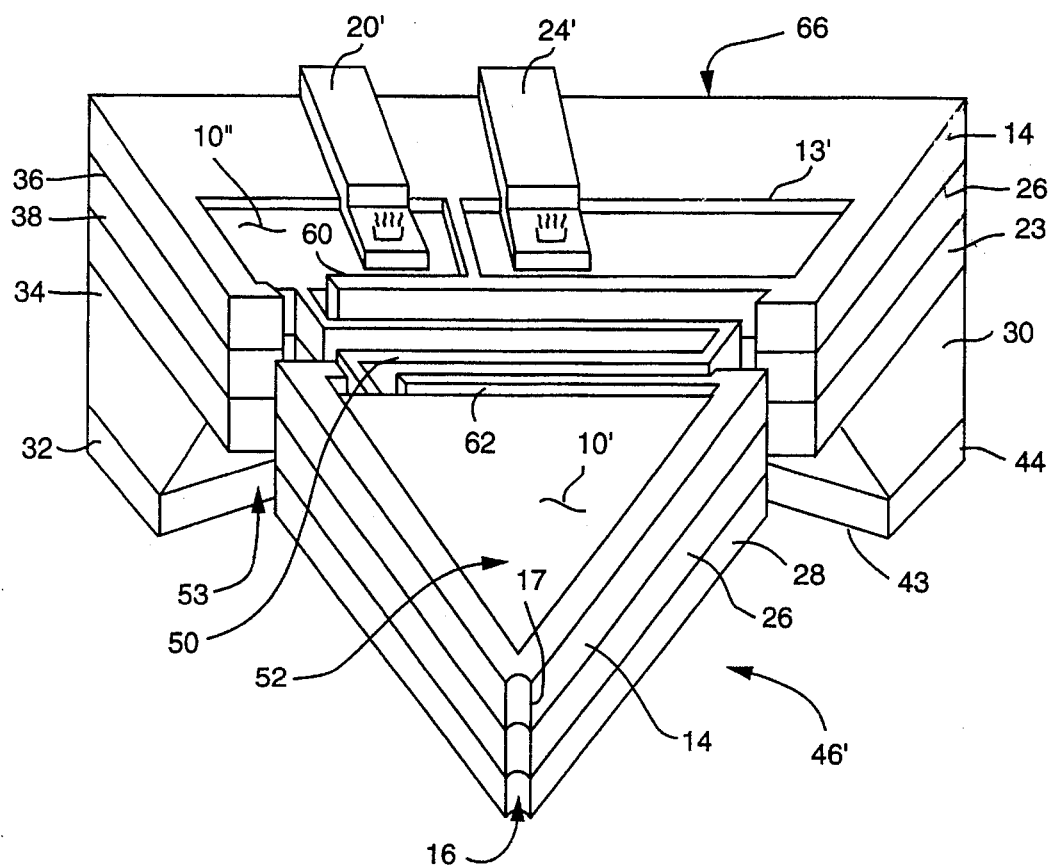

To obtain the configuration of FIG. 11b from that of FIG. 11a requires several steps that are similar to the steps illustrated in FIG. 9 for the PSP embodiment. First, a window in new protective layer 10' in region 64 and window 17 in top protective layer 14 are opened. Then the substrate is etched completely through in those regions to form spring 50 and pinhole 16. Spring 50 interconnects the thicker perimeter portion 66 of the substrate with the thinner floating platform 52 in the interior of the substrate, platform 52 substantially incorporates the PSP structure of the previous embodiment. Note here that spring 50 is shown here having a single loop, however, additional loops could be created if desired to permit greater movement of platform 52 to orient pinhole 16 relative to the light beam directed through it.

Additionally, note that photodetector contact trace 20' is electrically interconnected with p+ conductivity layer 42' beneath new protective layer 10' since p+ conductivity layer 42' extends through spring 50 in top wafer 26.

Figure 11C:
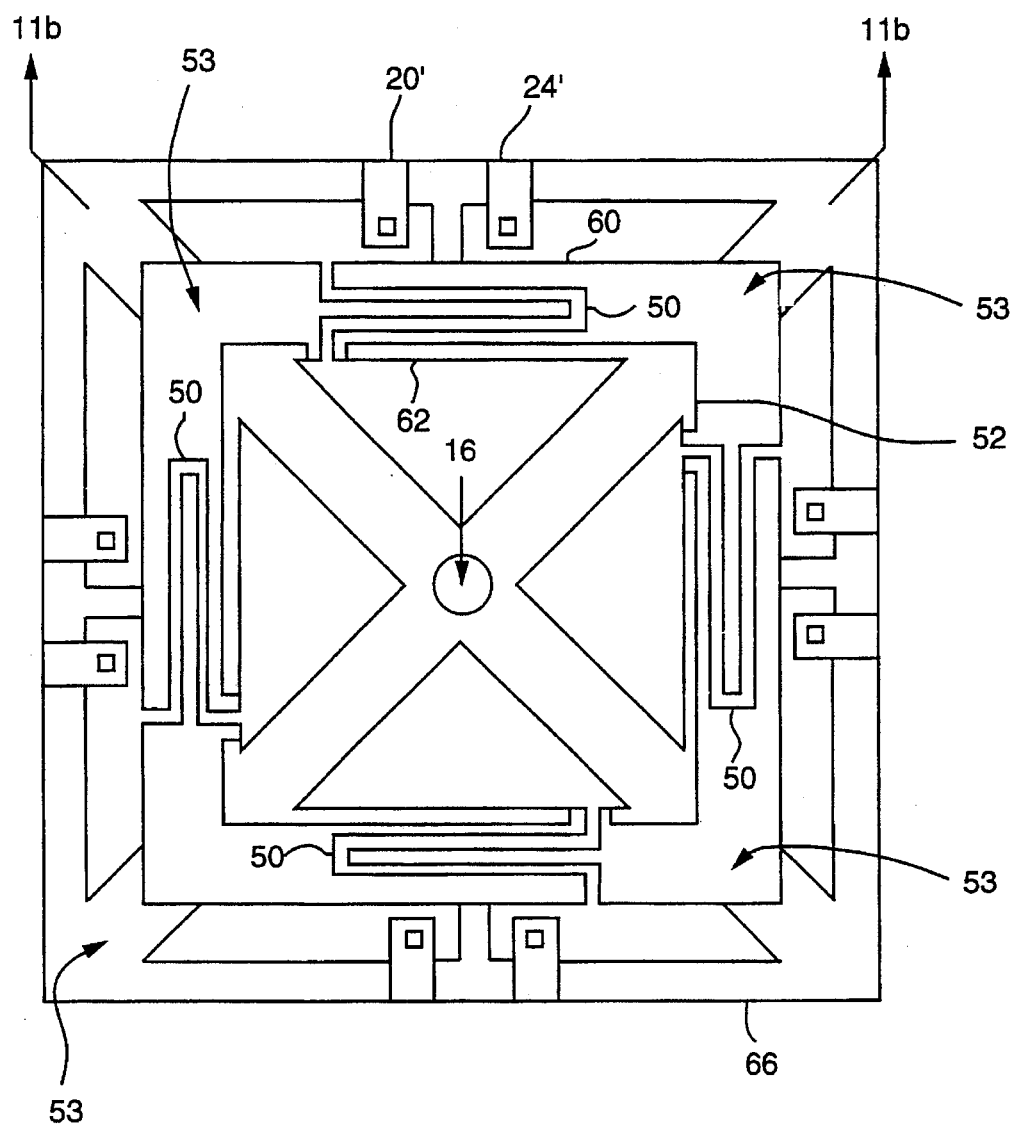
FIG. 11c shows a top plan view of a completed MPSP component of the preferred embodiment, made up of 4 symmetric quadrants.

FIG. 11c shows a top plan view of a completed, four-quadrant MPSP of the second embodiment of the present invention. To assist in the visualization of this structure first focus on the fact that areas 53 are voids, or removed semiconductor material areas that extend completely through the substrate. Thus, there are three general areas of the MPSP substrate: the thinned platform 52 that defines pinhole 16 centrally therethrough; the thick continuous perimeter portion 66 that encircles platform 52; and four springs 50 connected to the inner edge of perimeter portion 66 that interconnect, mechanically and electrically, and provide the sole support for platform 52.

This configuration allows platform 52 to be moved in any planar direction separately from the perimeter portion 66 of the substrate. The standard operation for a MPSP is therefore to measure the position of incident light relative to the pinhole 16 using the PSP function of platform 52, using either split-cell or continuous-cell techniques described previously. Then, using that measured position information, circuitry external to the MPSP can be used to cause an externally supplied actuation mechanism to move the MPSP platform in such direction as to reduce pinhole to light beam position offset.

The third embodiment of the present invention is a capacitively actuated MPSP (CAMPSP) to automatically facilitate the positioning of the pinhole either initially, or during operation when a positional shift of the pinhole has occurred. The process steps to produce a device of this type is similar to that of the MPSP. To illustrate the process for production of an CAMPSP is discussed by using the cross-sectional projection of a single quadrant of device at different stages of the production. As with the PSP, it should be remembered that the use of a quadrant structure is for illustrative purposes only, and that the finished device may have as many sectors as desired.

Figure 12A:
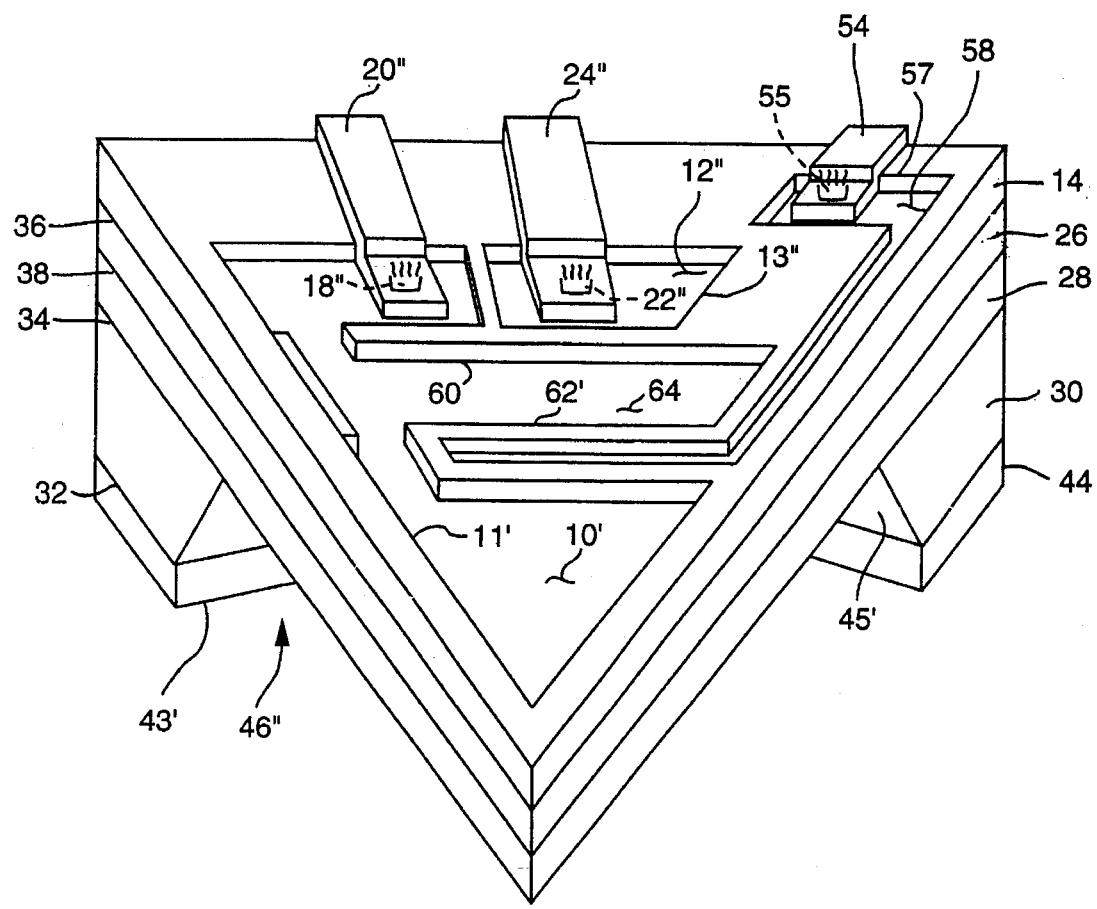
FIGS. 12a–12b are cross-sectional projections the semiconductor substrate of FIGS. 4a and 4b as modified to form a capacitively actuated movable position sensitive pinhole (CAMPSP).

Referring first to FIG. 12a shows a cross-sectional projection of a single quadrant of a partially completed capacitively actuated MPSP (CAMPSP) embodiment. The fabrication steps that are necessary to achieve the configuration of FIG. 12a are substantially the same as those necessary to achieve the configuration of the MPSP device in FIG. 11a. Comparing FIG. 12a with FIGS. 4a and 11a, window 13" compares to windows 13 and 13' with an n+ conductivity layer 40" beneath new top protective layer 12". Similarly, when FIG. 11a is compared to FIGS. 5a and 11a, window 11" compares to windows 11 and 11' with a p+ conductivity layer 42" beneath new protective layer 10". Additionally, FIG. 12a includes a third window 57 through top protective layer 14 that includes a thinned protective layer 58 covering a p+ conductivity layer 56 (see FIG. 12b) which is identical to, but not connected to, p+ conductivity layer 42 beneath new protective layer 10". Since p+ conductivity layers 56 and 42 are identical, p+ conductivity layer 56 can be introduced during the same manufacturing step that p+ conductivity layer 42 is introduced. Similarly, protective layers 10" and 58 can be grown during the same step as well.

Additionally, a window is opened in protective layer 58 when windows 18" and 22" are opened, with an actuator control metal trace 54 being introduced contact window 55 to make connection with p+ conductivity region 58. This operation is similarly performed during the metalization step in which contact traces 20" and 24" are created.

In window 11", two of the window defining features 60 and 62' define a region 64 between them where spring structure 50 (see FIG. 12b) is to be formed. Window defining feature 62' in FIG. 12a is a "U" shaped structure that extends across new protective layer 10" which also defines within that "U" shape an finger like extension of p+ conductivity layer 56 beneath protective layer 58 to form a capacitive finger 70 (see FIG. 12b) between spring 50 and platform 52' after the fabrication of the CAMPSP device is completed.

Next, by comparing FIGS. 12a, 11a and 6a, it can be seen that here that etch mask window 43' has been sized and shaped so that the etched cavity boundary 45' in the bottom of the device is substantially aligned with window defining feature 60 on the top of the device. Cavity 46" is created in the same way described for the creation of cavity 46 for the PSP embodiment. Then in the same way as described in relation to FIGS. 7a and 8a, contact windows 18", 22" and 55 are opened in the regions within windows 10", 12" and 57, followed by the metalization of photodetector contact trace 20", substrate contact trace 24" and control metal trace 54.

Figure 12B:
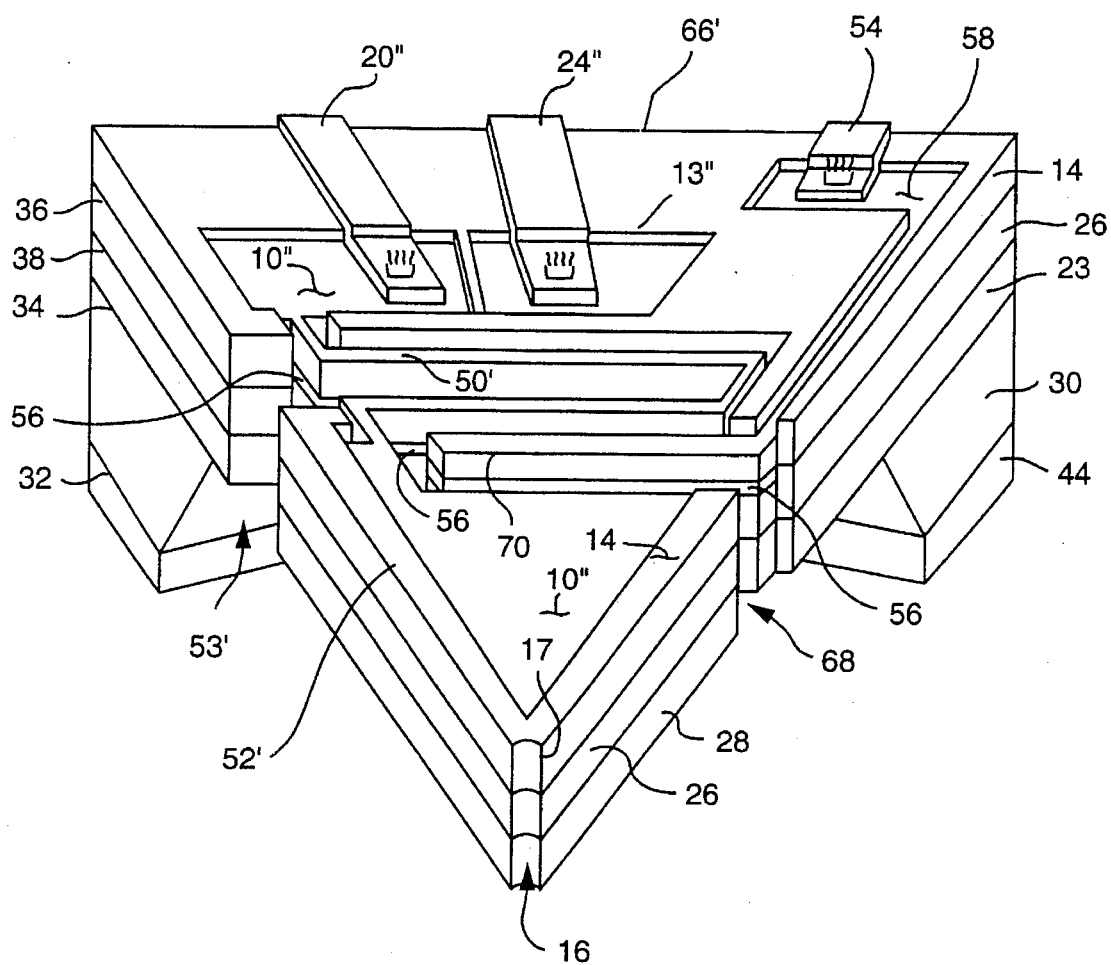

To obtain the configuration of FIG. 12b from that of FIG. 12a requires several Steps that are similar to the steps illustrated in FIG. 9 for the PSP embodiment and those discussed with respect to FIG. 11b for the MPSP embodiment. First, a window in new protective layer 10" in region 64 that extends around "U" shaped feature 62', and window 17 in top protective layer 14 are opened. Then the substrate is etched completely through in those regions to form spring 50', capacitive finger 70 and pinhole 16. Spring 50' interconnects the thicker perimeter portion 66' of the substrate with the thinner floating platform 52' in the interior of the substrate, with capacitive finger 70 intermediate platform 52' and the adjacent side of spring 50'. Here, as in the MPSP embodiment, platform 52' substantially incorporates the PSP structure of the first embodiment. Note that spring 50' is shown here having a single loop, however, additional loops could be created if desired to permit greater movement of platform 52' to orient pinhole 16 relative to the light beam directed through it. Additionally, note that photodetector contact trace 20" is electrically interconnected with p+ conductivity layer 42" beneath new protective layer 10" since p+ conductivity layer 42" extends through spring 50' in top wafer 26. Additionally, FIG. 12b shows p+ conductivity layer 56 extending throughout capacitive finger 70.

Figure 12C:
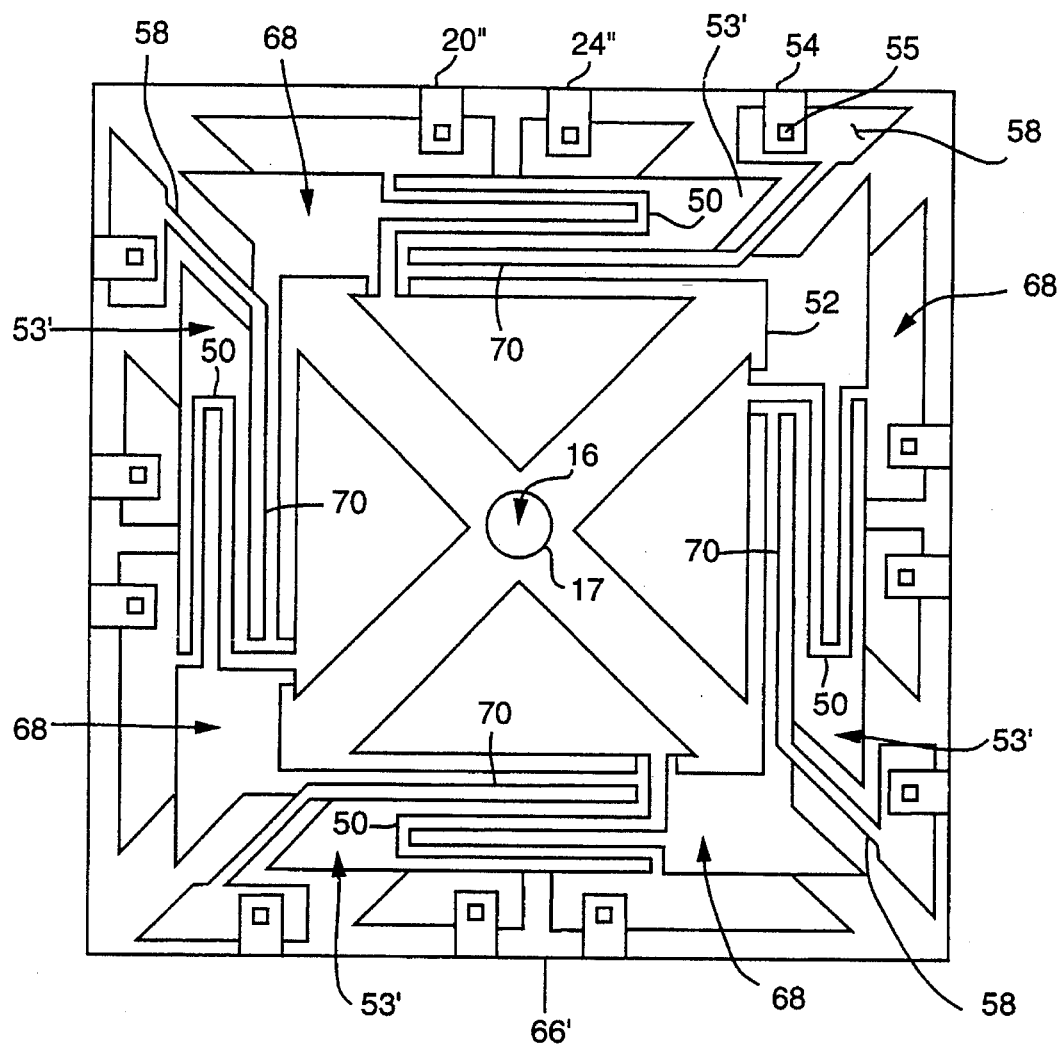
FIG. 12c shows a top plan view of a completed CAMPSP component of the preferred embodiment, made up of 4 symmetric quadrants.

FIG. 12c shows a top plan view of a completed four-quadrant CAMPSP of the third embodiment of the present invention. To assist in the visualization of this structure first focus on the fact that areas 53' and 68 are voids, or removed semiconductor material areas that extend completely through the substrate. Thus, there are four general areas of the CAMPSP substrate: the thinned platform 52' that defines pinhole 16 centrally therethrough; the thick continuous perimeter portion 88' that encircles platform 52'; four springs 50' connected to the inner edge of perimeter portion 66' that interconnect, mechanically and electrically, and provide the sole support for platform 52'; and four capacitive fingers 70, one in each quadrant, intermediate platform 52' and spring 50'.

In order to function as one plate of a capacitive actuation mechanism, p+ conductivity layer 56 must be confined to an area outside of platform 52', separated by etched semiconductor area 53'. Using the separate actuator control metal trace 54 and substrate contact trace 24", a voltage difference can be applied between p+ conductivity layer 56 outside of platform 52' and top semiconductor wafer 26 of platform 52'. Such a voltage difference necessarily results in capacitive attraction between p+ conductivity layer 56 and platform 52' by electrostatic forces. The CAMPSP embodiment therefore is manufactured in such a way that it contains both an element (a PSP) which can detect the relative position of pinhole 16 and an incident light beam and an element which can move the platform 52' which contains pinhole 16. The standard operation for a CAMPSP will therefore be to measure position of incident light relative to pinhole 16, using either split-cell or continuous-cell techniques described previously. From the measured position information, circuitry external to the MPSP can be used to apply a voltage difference between the desired control metal trace 54 and substrate contact trace 24", causing platform 56' to move towards electrically charged p+ conductivity layer 58' in such direction as to reduce pinhole to light beam position offset.

After a completed PSP, MPSP, or CAMPSP component is separated from the remainder of the substrate, that portion of the bottom wafer which was not removed in the etching of the cavity now forms a solid frame surrounding the pinhole. In the MPSP and CAMPSP embodiments, the solid frame surrounds a platform containing the pinhole, which platform is tethered to the remaining substrate of tile separated MPSP or CAMPSP component. In the CAMPSP embodiment, the platform is adjacent to capacitor plates which can be used to cause platform movement in response to the detected position of a light beam relative to the pinhole.

Although the description above primarily discusses the use of presently known fabrication techniques, some of specific technologies involved in the preferred embodiment are expected to change as techniques evolve through time. It should be understood that the present invention is broad in concept and terms and is not limited to the specific fabrication steps or final configurations shown here. Other configurations could be generated for various applications using known fabrication steps, and with new fabrications techniques as they evolve.

As will be understood by those familiar with the art, the present invention may be embodied in other specific forms methods of manufacture without departing from the spirit or essential characteristics thereof. Therefore, the scope of the present invention is limited only by the scope of the claims appended hereto.

What is claimed is:

1. A combined thin film pinhole and semiconductor photodetector array for use with an external electrical biasing source and current measurement devices in optical applications, said combined thin film pinhole and semiconductor photodetector array comprising:

a semiconductor substrate of a selected material defining a pinhole having a perimeter of a selected size and shape therethrough said substrate; and said substrate including thereon an array of a selected number of photodiodes formed thereon at selected locations around the perimeter of said pinhole.

2. An optical system comprising:

a combined thin film pinhole and semiconductor photodetector array having:

a semiconductor substrate of a selected material defining a pinhole having a perimeter of a selected size and shape therethrough said substrate; and said substrate including thereon an array of a selected number of photodiodes formed thereon at selected locations around the perimeter of said pinhole; and an external electrical biasing source connected to said photodiodes of said semiconductor substrate to backbias each of said photodiodes; and a plurality of current measurement devices connected to said photodiodes of said semiconductor substrate to detect variations in individual currents as a result of variations in illumination of each of said photodiodes.

3. The combined pinhole and semiconductor photodetector array as in claim 1 wherein said semiconductor photodetector array can determine spatial relationships between said pinhole and illumination from a remote light source incident on said semiconductor photodetector array.

4. The combined pinhole and semiconductor photodetector array of claim 1 wherein:

said pinhole perimeter shape is selected to be circular; and said semiconductor substrate is selected to be sufficiently thin to allow substantial transmission of light through the pinhole.

5. The combined pinhole and semiconductor photodetector array of claim 4 wherein said pinhole is suitable for optical spatial filtering.

6. The combined pinhole and semiconductor photodetector array of claim 1 further includes an electronic means for biasing, current measurement or voltage measurement of the elements of said semiconductor photodetector array on said semiconductor substrate.

7. The combined pinhole and semiconductor photodetector array of claim 6 wherein said thin film pinhole can be used without external electrical means for biasing, current measurement or voltage measurement.

8. The combined pinhole and semiconductor photodetector array of claim 1 further includes a predetermined number of semiconductor spring elements which attach the portion of said semiconductor substrate surrounding said pinhole to the remainder of the substrate.

9. The combined pinhole and semiconductor photodetector array of claim 8 wherein said spring elements allow relative motion between the portion of said semiconductor substrate surrounding said pinhole and the remainder of the substrate by compression, extension, or torsion of said spring elements.

10. The combined thin film pinhole and semiconductor photodetector array of claim 1 further includes:

a predetermined number of semiconductor spring elements which attach the portion of said semiconductor substrate surrounding said pinhole to the remainder of the substrate; and a predetermined number of electrical capacitor structures, each capacitor structure having:

a predetermined number of electrically accessible elements on the portion of said semiconductor substrate surrounding said pinhole; and a predetermined number of electrically accessible elements on the remainder of the substrate, separate from said electrically accessible elements on said portion of said semiconductor substrate surrounding said pinhole.

11. The combined thin film pinhole and semiconductor photodetector array of claim 10 wherein said electrical capacitor structures provides relative motions between the portion of the substrate containing said pinhole and the remainder of the substrate by providing force to cause compression, extension, or torsion of said spring elements.

12. An optical system comprising:

a combined thin film pinhole and semiconductor photodetector array having:

a semiconductor substrate of a selected material having a pinhole of predetermined size and shape through said semiconductor substrate; and an array of a predetermined number of semiconductor photodetectors formed on said semiconductor substrate at selected locations around the perimeter of said pinhole; and an electronic means for biasing, current measurement or voltage measurement of the elements of said semiconductor photodetector capable of detecting variations in the light induced current or voltage resulting from variations in illumination of each element of said photodetector array.

13. The optical system of claim 12 wherein said optical system functions as both an optical element and provides an alignment signal of said optical element.

14. The optical system of claim 12 further includes an electrically controlled visual display means for displaying information describing the variations in illumination of each element of said semiconductor photodetector array.

15. The optical system of claim 14 wherein said optical system provides visual feedback to an operator in order to enable said operator to determine the spatial relationship between said pinhole and illumination from a remote light source incident on said semiconductor photodetector array.

16. The optical system of claim 12 further including:

a mechanical mounting means for holding said combined thin film pinhole and semiconductor photodetector array while allowing movement of the thin film pinhole relative to a fixed reference point; and an electrical computation system means for controlling the motion of said mechanical mounting means in response to said detected variations in said current or voltage resulting from said variations in illumination of each element of said photodetector array.

17. The optical system of claim 16 wherein said optical system comprises a means for causing said thin film pinhole and incident illumination from a remote light source to be brought into coincidence.

18. A position sensing photodetector array comprising a semiconductor substrate including multiple photodiode elements, with each of said multiple photodiode elements:

sharing a common anode or a common cathode with all other elements of said photodetector array; and having an anode or a cathode which is separate from all other elements of said photodetector array; and having a separate connection to said common anode or common cathode at a position unique to each of said elements of said semiconductor photodetector array.

19. The position sensing photodetector array of claim 18 wherein said position sensing photodetector array provides an electrically readable means for determining the spatial relationship between said multiple photodiode elements and incident illumination from a remote light source.

20. The position sensing photodetector array of claim 18 wherein said position sensing photodetector array can be switched between split cell and continuous cell operation conditions by selection of bias and measurement circuitry appropriate to the selected operation conditions.

21. The position sensing photodetector array of claim 18 further defines a pinhole having a perimeter of a predetermined size and shape through said semiconductor substrate.

22. The position sensing photodetector array of claim 21 wherein said position sensing photodetector array provides a means for allowing multiple techniques for determining spatial relationships between said pinhole and illumination from a remote light source incident on said semiconductor substrate surrounding said pinhole.

\* \* \* \* \*